United States Patent
Kalachev et al.

(10) Patent No.: US 10,879,927 B2
(45) Date of Patent: Dec. 29, 2020

(54) COMPACT LOW DENSITY PARITY CHECK (LDPC) BASE GRAPH

(71) Applicant: Futurewei Technologies, Inc., Plano, TX (US)

(72) Inventors: Gleb Vyacheslavovich Kalachev, Moscow (RU); Ivan Leonidovich Mazurenko, Khimki (RU); Elyar Eldarovich Gasanov, Moscow (RU); Carmela Cozzo, San Diego, CA (US); Jie Jin, Moscow (RU)

(73) Assignee: Futurewei Technologies, Inc., Plano, TX (US)

(*) Notice: Subject to any disclaimer, the term of this patent is extended or adjusted under 35 U.S.C. 154(b) by 177 days.

(21) Appl. No.: 15/978,678

(22) Filed: May 14, 2018

(65) Prior Publication Data
US 2018/0337691 A1    Nov. 22, 2018

Related U.S. Application Data

(60) Provisional application No. 62/507,510, filed on May 17, 2017.

(51) Int. Cl.
*H03M 13/11* (2006.01)
*H03M 13/00* (2006.01)
*H03M 13/03* (2006.01)

(52) U.S. Cl.
CPC ..... *H03M 13/1105* (2013.01); *H03M 13/036* (2013.01); *H03M 13/116* (2013.01); *H03M 13/1111* (2013.01); *H03M 13/616* (2013.01); *H03M 13/6362* (2013.01); *H03M 13/6516* (2013.01)

(58) Field of Classification Search
CPC ........... H03M 13/1105; H03M 13/116; H03M 13/1111; H03M 13/6516; H03M 13/036; H03M 13/6362; H03M 13/616
See application file for complete search history.

(56) References Cited

U.S. PATENT DOCUMENTS

| 2007/0041458 A1 | 2/2007 | Hocevar et al. |
| 2010/0287438 A1 | 11/2010 | Lakkis |
| 2014/0068393 A1 | 3/2014 | Varnica et al. |

(Continued)

FOREIGN PATENT DOCUMENTS

| CN | 101150551 A | 3/2008 |
| CN | 103684476 A | 3/2014 |

OTHER PUBLICATIONS

S. I. Park et al., "Two Dimensional Code Based on Low Density Parity Check and Reed-Solomon Codes for the Terrestrial Cloud Transmission System," in IEEE Transactions on Broadcasting, vol. 61, No. 1, pp. 75-83, Mar. 2015. (Year: 2015).*

*Primary Examiner* — Cynthia Britt
(74) *Attorney, Agent, or Firm* — Slater Matsil, LLP

(57) ABSTRACT

A decoding method, an encoding method, a decoder and an encoder are disclosed. In an embodiment the decoding method includes receiving, at a receiver of a receiving side, signals from a transmitting side, the signals including a code word and decoding, at a decoder of the receiving side, the code word using a low density parity check (LDPC) code in which each n adjacent rows, n>1, in an extension part of a base parity check matrix (PCM) are orthogonal except for punctured information columns.

20 Claims, 31 Drawing Sheets

(56) References Cited

U.S. PATENT DOCUMENTS

2017/0331497 A1* 11/2017 Richardson ....... H03M 13/6362
2018/0226992 A1*  8/2018 Panteleev ............ H03M 13/116
2019/0013827 A1*  1/2019 Richardson ........... H04L 1/0057
2019/0260390 A1*  8/2019 Shutkin .............. H03M 13/1137
2019/0349006 A1* 11/2019 Ma ........................ H03M 13/116

* cited by examiner

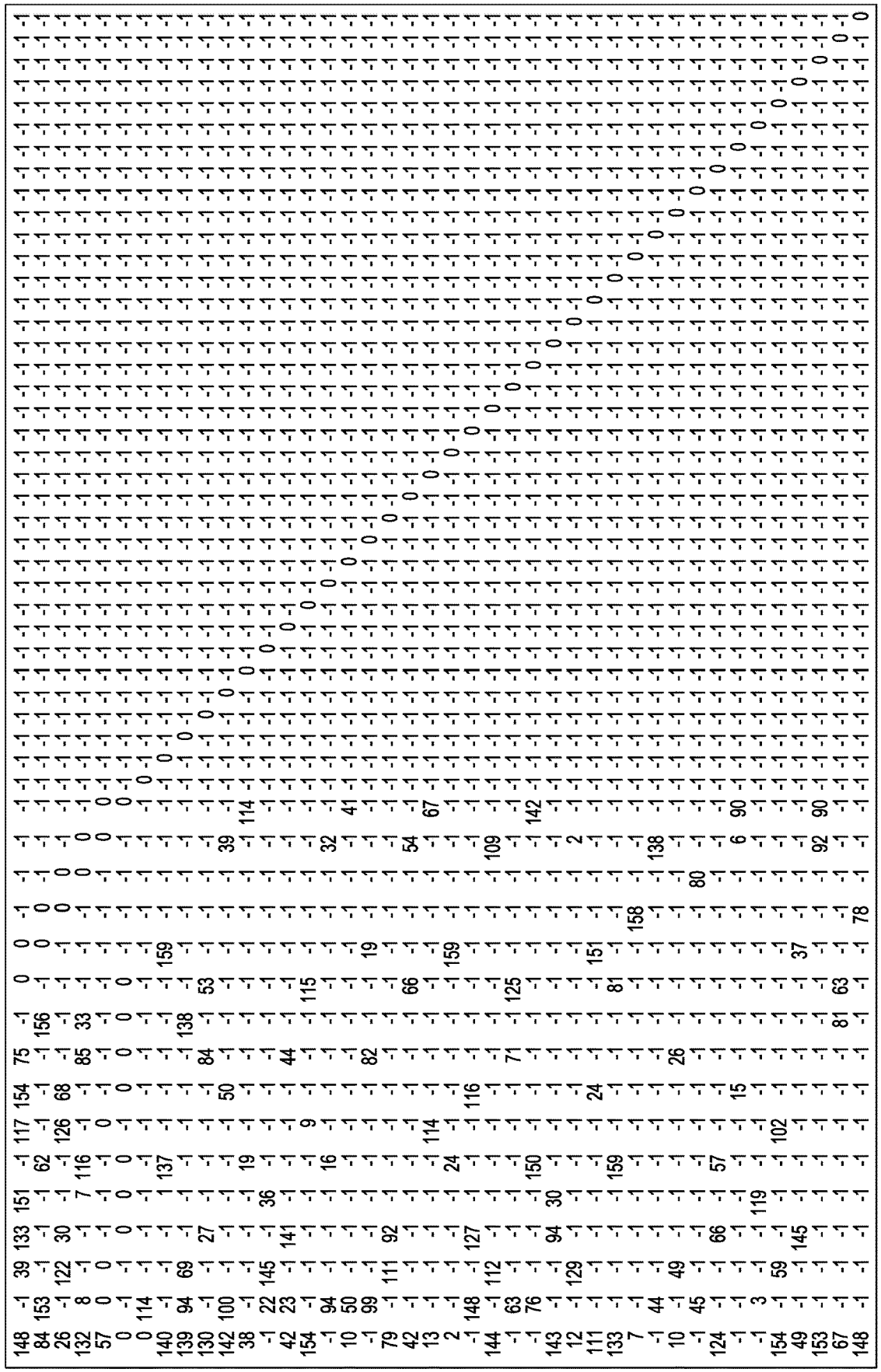

BASE GRAPH 2, LABELED PCM FOR a=12

| PCM | 0.200000 | 0.333333 | 0.400000 | 0.500000 | 0.666667 |
|---|---|---|---|---|---|
| BG#2 HUAWEI BGn#2 (Kb=16, Zmax=160) | 52800 | 34080 | 28320 | 22240 | 14880 |
| DISCLOSED GRAPHS 1 AND 2 (Kb=10, Zmax=256) | 48384 | 29184 | 24064 | 18688 | 12544 |
| BG#2: SAMSUNG (Kb=10, Zmax=256) | 48384 | 29696 | 24320 | 18688 | 12800 |
| BG#2: HUAWEI BG#2 (KB=10, Zmax=256) | 49920 | 29952 | 24576 | 18944 | 12288 |
| BG#2: QUALCOMM LOW (Kb=12, Zmax=384) | 50718 | 31030 | 25466 | 19688 | 13268 |

FIG. 6

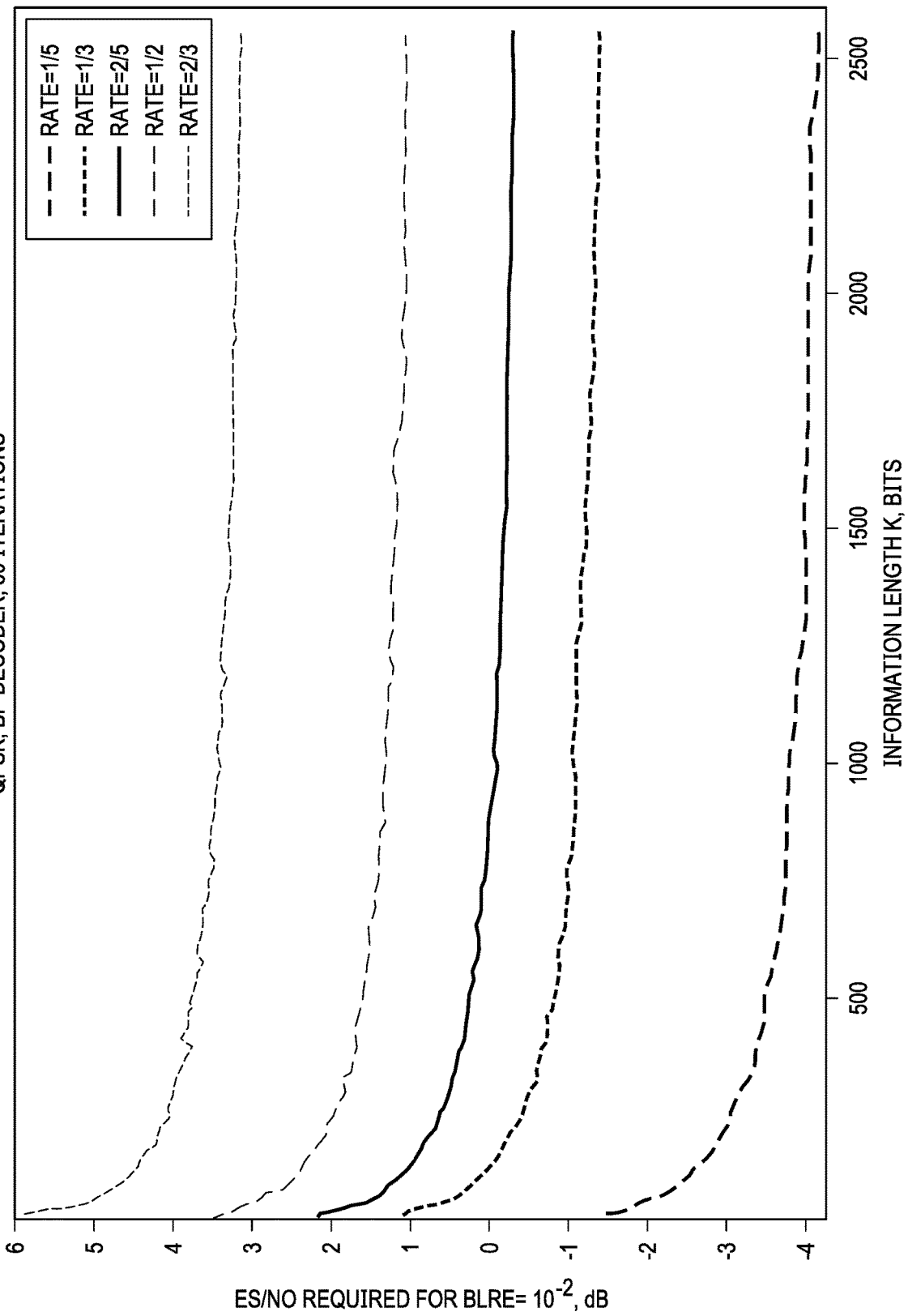

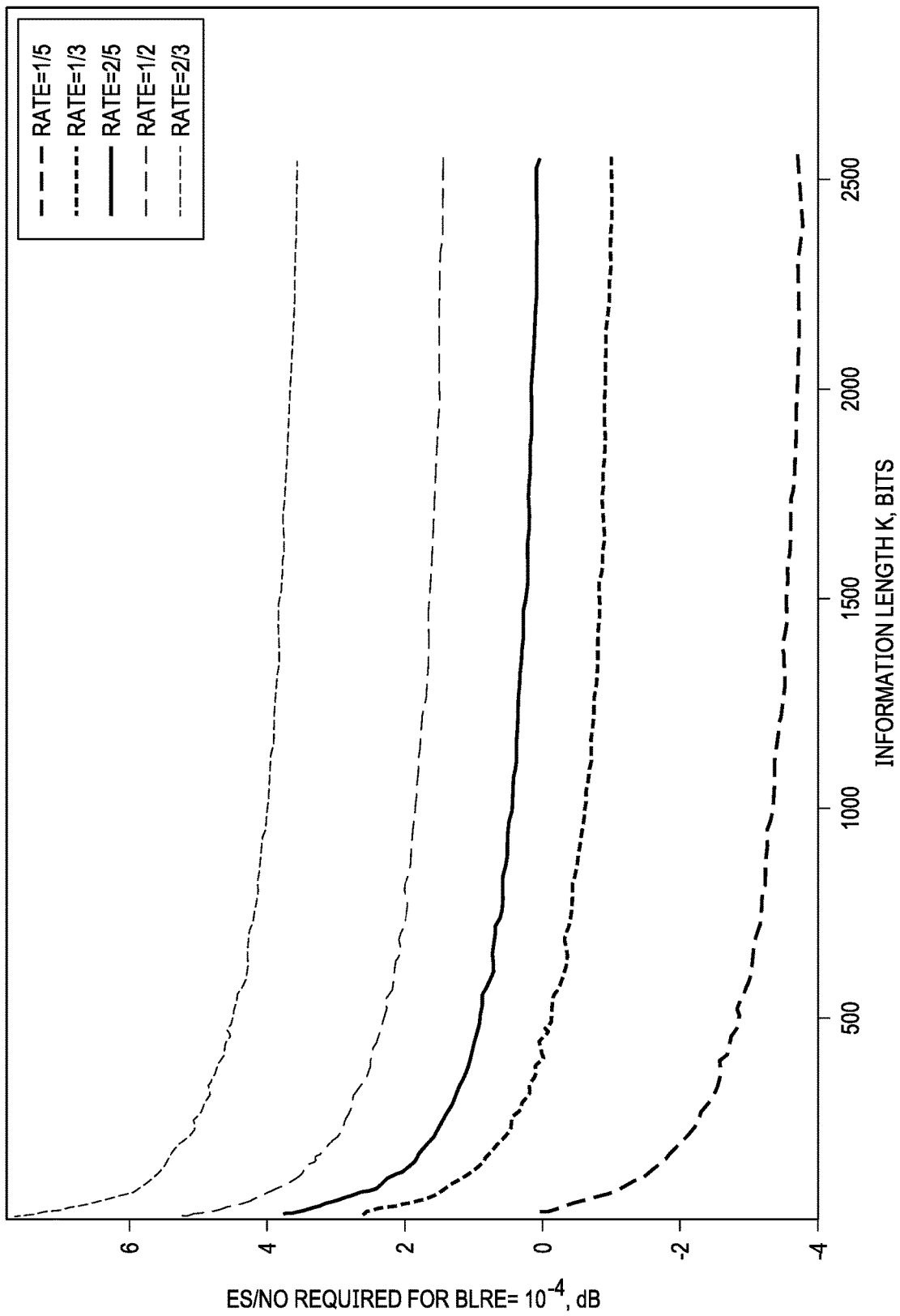

|     |     |     |     |     |     |     |     |     |     |
| --- | --- | --- | --- | --- | --- | --- | --- | --- | --- |
| 328 | 152 | 346 | 70  | 201 | 181 | 170 | 183 | 334 | 201 |
| 316 | 194 | 370 | 91  | 360 | 279 | 223 | 290 | 306 | 1   |
| 359 | 324 | 363 | 83  | 45  | 358 | 160 | 42  | 288 | 11  |
| 198 |     |     |     |     | 196 |     | 41  | 67  |     |
| 246 |     |     | 369 | 339 | 270 |     | 302 |     |     |
| 241 | 28  | 128 |     |     |     |     |     |     |     |
| 17  | 21  | 103 |     |     |     |     |     | 346 | 101 |
| 69  |     |     |     |     | 9   | 314 |     |     |     |
| 117 |     |     | 325 | 109 |     |     | 154 |     |     |

CORE B → (198, 246, 241 column / top-left dashed region)
CORE A → (17, 69, 117 column / bottom-left dashed region)

FIG. 15

$$\left\{\begin{array}{cccccccccccccccc|cccccccc} 3 & 0 & -1 & -1 & 2 & 0 & -1 & 3 & 7 & -1 & 1 & 1 & -1 & -1 & -1 & -1 & 1 & 0 & -1 & -1 & -1 & -1 & -1 & -1 \\ -1 & -1 & 1 & -1 & 36 & -1 & -1 & 34 & 10 & -1 & -1 & 18 & 2 & -1 & 3 & 0 & -1 & 0 & 0 & -1 & -1 & -1 & -1 & -1 \\ -1 & -1 & 12 & 2 & -1 & 15 & -1 & 40 & -1 & 3 & -1 & 15 & -1 & 2 & 13 & -1 & -1 & -1 & 0 & 0 & -1 & -1 & -1 & -1 \\ -1 & -1 & 19 & 24 & -1 & 3 & 0 & -1 & 6 & -1 & 17 & -1 & -1 & -1 & 8 & 39 & -1 & -1 & -1 & 0 & 0 & -1 & -1 & -1 \\ 20 & -1 & 6 & -1 & -1 & 10 & 29 & -1 & -1 & 28 & -1 & 14 & -1 & 38 & -1 & -1 & 0 & -1 & -1 & -1 & 0 & 0 & -1 & -1 \\ -1 & -1 & 10 & -1 & 28 & 20 & -1 & -1 & 8 & -1 & 36 & -1 & 9 & -1 & 21 & 45 & -1 & -1 & -1 & -1 & -1 & 0 & 0 & -1 \\ 35 & 25 & -1 & 37 & -1 & 21 & -1 & -1 & 5 & -1 & -1 & 0 & -1 & 4 & 20 & -1 & -1 & -1 & -1 & -1 & -1 & -1 & 0 & 0 \\ -1 & 6 & 6 & -1 & -1 & -1 & 4 & -1 & 14 & 30 & -1 & 3 & 36 & -1 & 14 & -1 & -1 & -1 & -1 & -1 & -1 & -1 & -1 & 0 \end{array}\right.$$

FIG. 16

COMPACT LOW DENSITY PARITY CHECK (LDPC) BASE GRAPH

CROSS-REFERENCE TO RELATED APPLICATIONS

This application claims the benefit of U.S. Provisional Application No. 62/507,510, filed on May 17, 2017, which application is hereby incorporated herein by reference.

TECHNICAL FIELD

The present application relates to data storage and communication technologies, in particular to methods and systems for encoding and decoding data using parity check codes. In particular, the present application relates to systems, methods, and devices for encoding/decoding data using Low-Density-Parity-Check (LDPC) codes.

BACKGROUND

Parity checking codes are used to facilitate the recovery of stored data as well as data transmitted through a communications channel. One type of parity check code is known as Low-Density-Parity-Check (LDPC) code, which is characterized by a sparse Parity Check Matrix (PCM), i.e., a PCM having a low percentage of 1's. An LDPC encoder at a transmitter is used for encoding source words to generate code words. An LDPC decoder at a receiver is used for decoding the received code words. LDPC codes of various rates are being widely adopted, or considered for adoption, in data storage and wireless communications technologies and standards such as those relating to IEEE 802.11 and 5G.

Almost all LDPC codes used in practice are quasi-cyclic (QC) LDPC with QC parity-check matrices, in which a quasi-cyclic identity matrix can be combined with an array of shift information (i.e., QC shift PCM) to define an expanded QC PCM (e.g., a QC LDPC PCM). QC LDPC encoding and recovery algorithms and the storage of PCM information consumes a lot of hardware resources, and accordingly, there is a need for methods, systems, and technologies that improve the efficiency of and reduce the hardware resources required for QC LDPC coding systems.

SUMMARY

An embodiment of the disclosure provides a decoding method that includes receiving, at a receiver of a receiving side, signals from a transmitting side, the signals including a code word; and decoding, at a decoder of the receiving side, the code word using a low density parity check (LDPC) code in which each n adjacent rows, n>1, in an extension part of a base parity check matrix (PCM) are orthogonal except for punctured information columns.

An embodiment of the disclosure provides an encoding method that includes encoding, at an encoder of a transmitting side, information bits into a code word and transmitting, at a transmitter of the transmitting side, signals to a receiving side, the signals including the code word, wherein the information bits are encoded using a LDPC code in which each n adjacent rows, n>1, in an extension part of a base parity check matrix (PCM) are orthogonal except for punctured information columns.

An embodiment of the disclosure provides a decoder that includes a processor and a computer readable storage medium storing programming for execution by the processor, the programming including instructions to decode a code word using a low density parity check (LDPC) code in which each n adjacent rows, n>1, in an extension part of a base parity check matrix (PCM) are orthogonal except for punctured information columns.

An embodiment of the disclosure provides an encoder that includes a processor; and a computer readable storage medium storing programming for execution by the processor, the programming including instructions to encode information bits into a code word, wherein the information bits are encoded using a low density parity check (LDPC) code in which each n adjacent rows, n>1, in an extension part of a base parity check matrix (PCM) are orthogonal except for punctured information columns.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 3A shows an embodiment of a first base graph;

FIGS. 3B-3I show embodiments of labeled PCMs of the first base graph;

FIG. 4A shows an embodiment of a second base graph;

FIGS. 4B-4I show embodiments of labeled PCMs of the second base graph;

FIGS. 5A-5E show specific features of labeled PCMs of a QC LDPC;

FIG. 6 shows table with different nested codes from different providers, the table provides a complexity evaluation of the first and second base graphs;

FIGS. 7A-7B show performances of the first base graph;

FIG. 15 illustrates an example code in which cores A and B have conflicts; and

FIG. 15 illustrates an embodiment QC matrix with an IRA structure.

Corresponding numerals and symbols in the different figures generally refer to corresponding parts unless otherwise indicated. The figures are drawn to clearly illustrate the relevant aspects of the embodiments and are not necessarily drawn to scale.

The present disclosure uses the following acronyms: BLER=block error rate; Es/No=energy per symbol to noise power spectral density; LDPC=low density parity-check code; PCM=parity check matrix; CPM=circulant permutation matrix; SPC=single parity check code; CN=check node;

VN=variable node; CNU=check node unit; QC=quasi-cyclic; BG=base graph; BP=belief-propagation decoding algorithm; NMSA=normalized min-sum decoding algorithm; and OMSA=offset min-sum decoding algorithm

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Embodiments of the disclosure provide rate adaptive codes (e.g., nested low density parity-check (LDPC) codes) with special features. These rate adaptive codes are low conflict codes enabling a simple hardware implantation of a decoder/encoder.

Embodiments of the disclosure provide two concrete base graphs each having an excellent combination of performance (Es/No (energy per symbol to noise power spectral density) to provide both block error rates (BLERs)=1 $e^{-2}$ and 1 $e^{-4}$) and complexity (number of edges in the base graph). This is particular true for low and intermediate rates.

Embodiments of the disclosure provide families of LDPC codes which reduce or avoid conflict while being processed in a decoder/encoder thereby reducing latencies and improving throughput, efficiency, power consumption and performance of the decoder/encoder.

A binary low density parity-check (LDPC) code is a linear block code specified by a very sparse binary M (or N−K)×N parity check matrix (PCM) so that H $x^T$=0, where x is a code word and H can be viewed as a bipartite graph where each column and row in H represents a variable node and a check node respectively. N represents the code word size (number of bits in a code word; number of code word bits (code word length)) and K is the information block size of a source word (number of information bits). A Tanner graph is a graphical representation of the PCM specifying the parity check equations.

Figure 1:
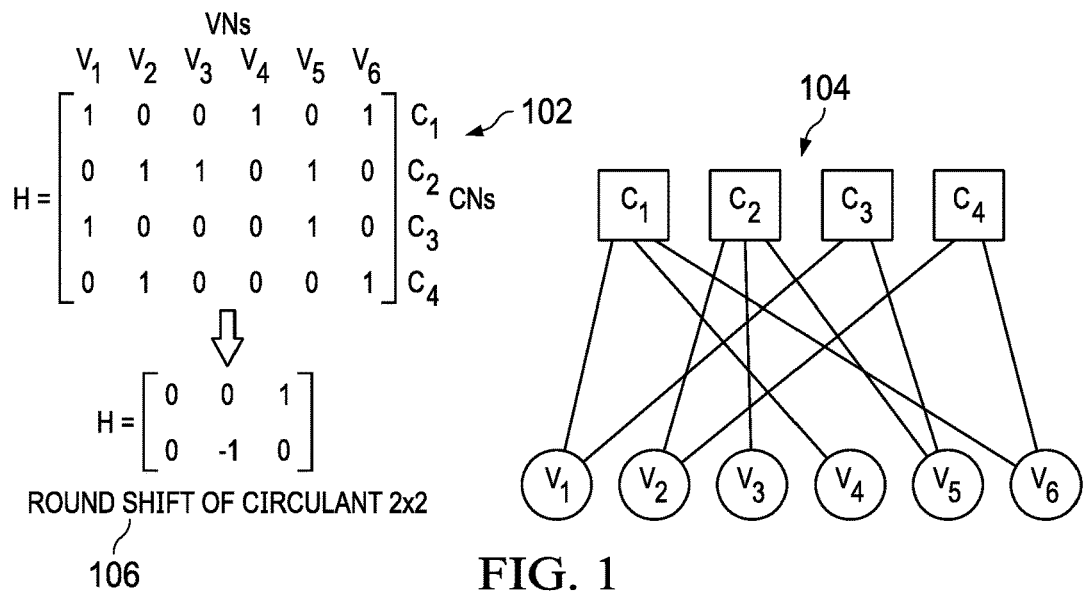
FIG. 1 is a diagram showing a 4 by 6 parity check matrix (PCM), H, its corresponding Tanner graph representation, and a Quasi-Cyclic (QC) PCM, $H_c$, of the 4×6 PCM H.

FIG. 1 shows the PCM H 102 as a 4×6 matrix and its corresponding Tanner graph representation 104. Accordingly, this PCM H 102 represents code words with a size of 6 bits and source words with a size of 2 bits. The respective Tanner graph 104 includes four check nodes (CNs) $c_1, c_2, c_3$, and $c_4$ and six variable nodes (VNs) $v_1, v_2, v_3, v_4, v_5$, and $v_6$. In the Tanner graph 104 shown in FIG. 1, the mth check node is connected to the nth variable node if, and only if, the nth element, $h_{mn}$, in the mth row in the PCM H 102 is 1.

A PCM are typically expressed as a structured matrix rather than a simple collection of binary ones and zeros. For example, such a structured matrix can be a Quasi-Cyclic (QC) matrix that is produced by cyclic permutation matrices with column weight 1. As shown in FIG. 1, the PCM H 102 can be partitioned into a set of square sub-matrices $P_i$ of size Z×Z that are either cyclic-permutations of an identity matrix $P_o$ or null submatrices with all zero entries. The matrix dimension Z of the sub-matrices $P_i$ is referred to as the circulant size and is also known as a lifting factor. The identity matrix $P_o$ has "1" entries on the diagonal from the top left corner to the bottom right corner and "o" entries everywhere else. An index value i can be used to denote the cyclic-permutation submatrix $P_i$ obtained from the Z×Z identity matrix $P_o$ by cyclically shifting the columns to the right by i elements.

By way of example, FIG. 1 illustrates the 4×6 PCM H 102 partitioned into a set of 2×2 square submatrices $P_i$. The submatrix $P_o$ is an identity matrix and submatrix $P_1$ is obtained by cyclically shifting the columns of submatrix $P_o$ to the right by 1. Structuring the PCM H 102 in such a way can produce a smaller structured PCM (e.g., a quasi-cyclic (QC) PCM). The 4×6 PCM H 102 can be expressed as a 2×3 QC PCM $H_c$ 106 when each submatrix is given a cyclic shift index value or a null value (e.g., identity sub-matrix $P_o$ is set 0, the sub-matrix $P_1$ is set to 1 and the zero sub-matrix is set to −1). Converting the PCM H 102 to the QC PCM $H_c$ 106 is typically referred to as "edge labeling" or simply "labeling." Also, H may be referred to as a protograph of the code (i.e., protograph matrix) and $H_c$ may be referred to as a labelled protograph or a labelled matrix.

A QC PCM matrix can be described in a more general way as:

$$H = \begin{pmatrix} e^{P11} & e^{P12} & \ldots & e^{P1nb} \\ e^{P21} & e^{P22} & \ldots & e^{P2nb} \\ e^{Pmb1} & e^{Pmb2} & \ldots & e^{Pmbnb} \end{pmatrix}$$

wherein H is a mbZ×nbZ PCM matrix with mb circulant row blocks, nb circulant column blocks and the circulant size Z, and wherein each circulant is either a circulant matrix (CPM) or the zero matrix.

Pij are integers in the range [−1, Z−1], $e^{Pij}$ is the Z×Z CPM corresponding to the right cyclic shift by Pij positions if 0 is smaller or equal than Pij and Pij is smaller than Z, and the Z×Z zero matrix if Pij is equal −1. The integers Pij are the exponents and the corresponding mb×nb integer matrix E(H)=(Pij)mb×nb is the exponent matrix of H. The QC LDPC codes and their PCMs may be defined by the corresponding exponent matrices E(H).

Once the lifted exponent matrix E(H)=(Pij)$_{mb \times nb}$ and the circulant size Z is obtained, the code word size of the code can be defined as (nb−2)×Z and the information block size kb×Z. These can be obtained by puncturing the bits corresponding to the first two circulant columns (see FIG. 2). The following can be defined: ΔK=$k_b$×Z−K and ΔN=$(n_b$−2)×Z−N−ΔK. If ΔN>0, ΔN redundant bits starting from the end of the code word can be punctured. After applying the puncturing, the punctured code word is obtained. If ΔK>0, the punctured code word is shortened by zero padding for the last ΔK bits in the punctured code word.

Figure 2:
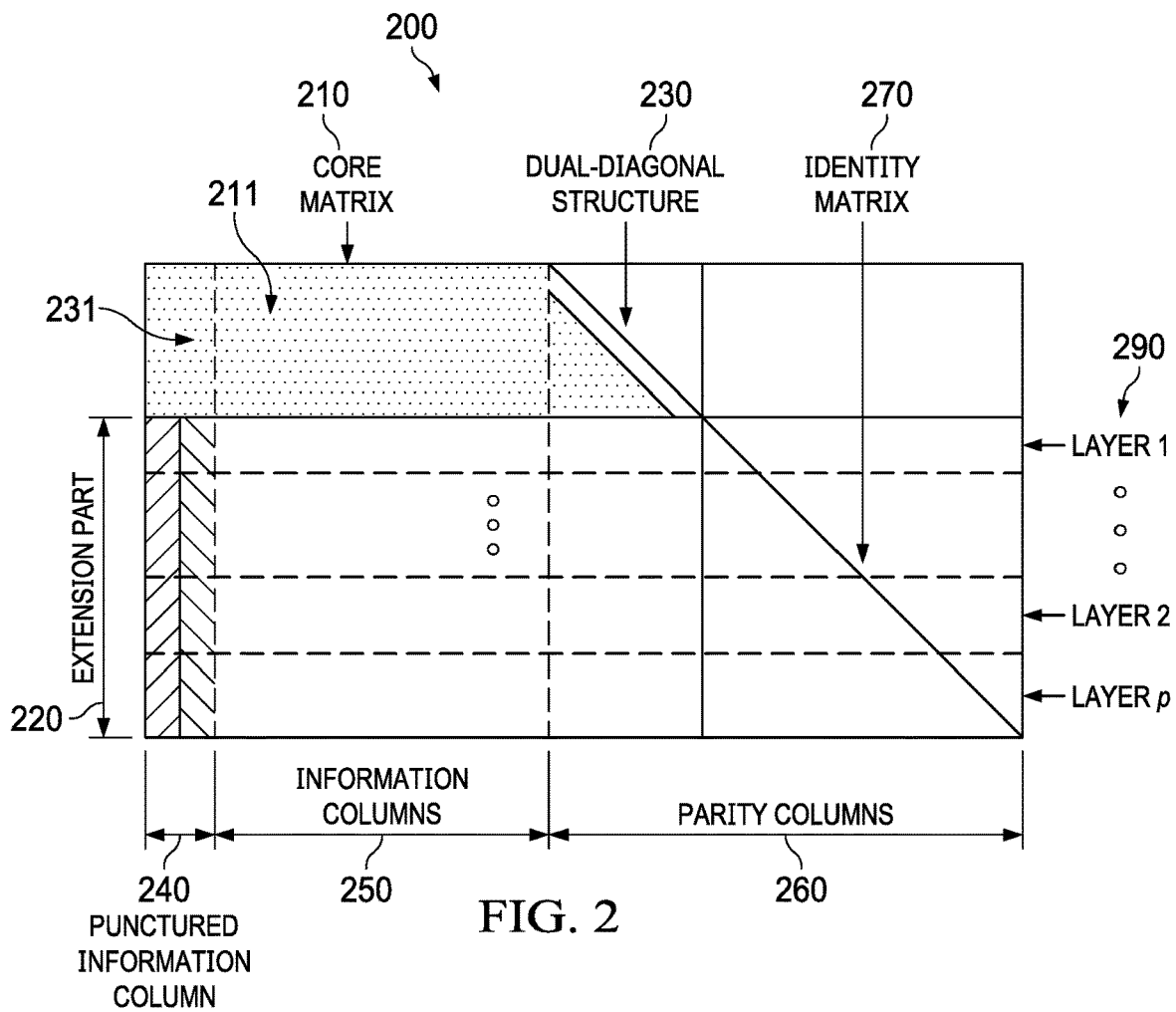
FIG. 2 shows a structure of a matrix of a QC LDPC.

FIG. 2 shows a general structure of a base graph (PCM) or lifted PCM such as a base graph or a lifted PCM for a QC LDPC code. The matrix 200 may include a core matrix 210 (grey) and an extension part 220. The core matrix 210 corresponds to the highest rate code. Lower rate codes include the core matrix 210 and the extension part 220. Different matrix sizes (e.g., different number of columns and rows) represent different rates with different number of information bits and parity bits.

The matrix 200 can also be defined along columns. The matrix 200 may include punctured information columns 240 (e.g., two punctured information columns, alternatively, more or less than two punctured columns are used such as 0, 1, 3, etc.), information columns 250 (e.g., number of columns between the punctured information columns and the parity columns) and parity columns 260. The matrix 200 can further be described as including an identity matrix 270 with, in this case, a dual diagonal structure 280 (dual diagonal parity check columns) in the identity matrix portion of the core matrix 210.

The matrix may be processed in the decoder/encoders along rows or layers 290, i.e., row by row.

A family of matrices (having different sizes) can be generated from a core matrix (the highest rate matrix). The following describes a rough outline how these matrices can be generated. The family of matrices for an LDPC code is called a nested LDPC code (e.g., a single nested LDPC code (family of codes) can be generated from a single base graph?).

Single parity check (SPC) extension is a common method for an LDPC code to realize rate matching (called Raptor-like structure or nested base graph structure). It starts from a high rate (R=N/K) LDPC core matrix (including the dual-diagonal matrix structure (core matrix 210 with dual diagonal structure 280)). To achieve lower rates, the high rate core matrix 210 is extended.

A nested QC LDPC code includes several matrices that are obtained from a high-rate core matrix/graph using an extension by several single parity-check codes (SPCs). The nested QC LDPC code can be regular or irregular. A regular QC-LDPC code is a code where all columns of the PCM have the same weight. In contrast, an irregular QC-LDPC code is a code where the columns have different weights.

In order to obtain codes with different number of information bits and parity bits a length and rate adaption scheme is used. This is achieved by using puncturing (removing) both information and parity bits, and by shortening (zero padding) the information bits. For all rates that correspond to the first one or more punctured information columns 240 of the matrix 200, the columns 240 may be punctured (because the punctured information are not transmitted but assumed to contain zero bits during decoding). These punctured information columns 240 may have relatively high column weight among all the information columns 240/250 and are called High-Weight (HW) columns.

Modern decoders may be multicore decoders having several check node unit (CNUs), called cores. The multicore decoder can process a code in parallel (decoder parallelism). For example, the multicore decoder is a multicore block parallel decoder. The multicore decoder may process several adjacent rows (layers 290) of a matrix 200 (e.g., PCM) in parallel at the same time, i.e., core A operates on a first row (e.g., layer 1) and core B operates on another adjacent row (layer 2). Each row may have a circulant size Z and processing adjacent rows at the same time may mean that each core can process one circulant block of the matrix 200 per one clock cycle. Alternatively, the multicore decoder can process non-adjacent rows of the matrix at the same time.

For the multicore decoder, the circulant rows of the matrix 200 are processed by a certain order during the decoding iteration, and several CNUs process different circulant rows simultaneously to increase the throughput. In such multicore cases when the input data (the sum of channel LLR and the check-to-variable messages) for core A is not ready because core B (it may be the same core than core A) has not yet finished the previous circulant row, a conflict occurs. The more conflicts a code has the slower the decoder typically performs the decoding. A conflict can be identified when two adjacent vertical cells of a PCM are non-empty. As shown in FIG. 15, the cores A and B operate on two adjacent rows and these rows have at least three conflicts 241/17, 28/21, 128/103, wherein the numbers reflect the size of the circulant shifts.

Embodiments of the disclosure provide base graph and related labeled matrices for an LDPC code. The base graph/matrices have reduced or no conflict when processed in the encoder/decoder. The encoder/decoder may have reduced, limited or no stalls based on conflicts of the LDPC code. Based on the embodiment LDPC code, the encoder/decoder can operate with simplified hardware implementation.

Figure 3A:
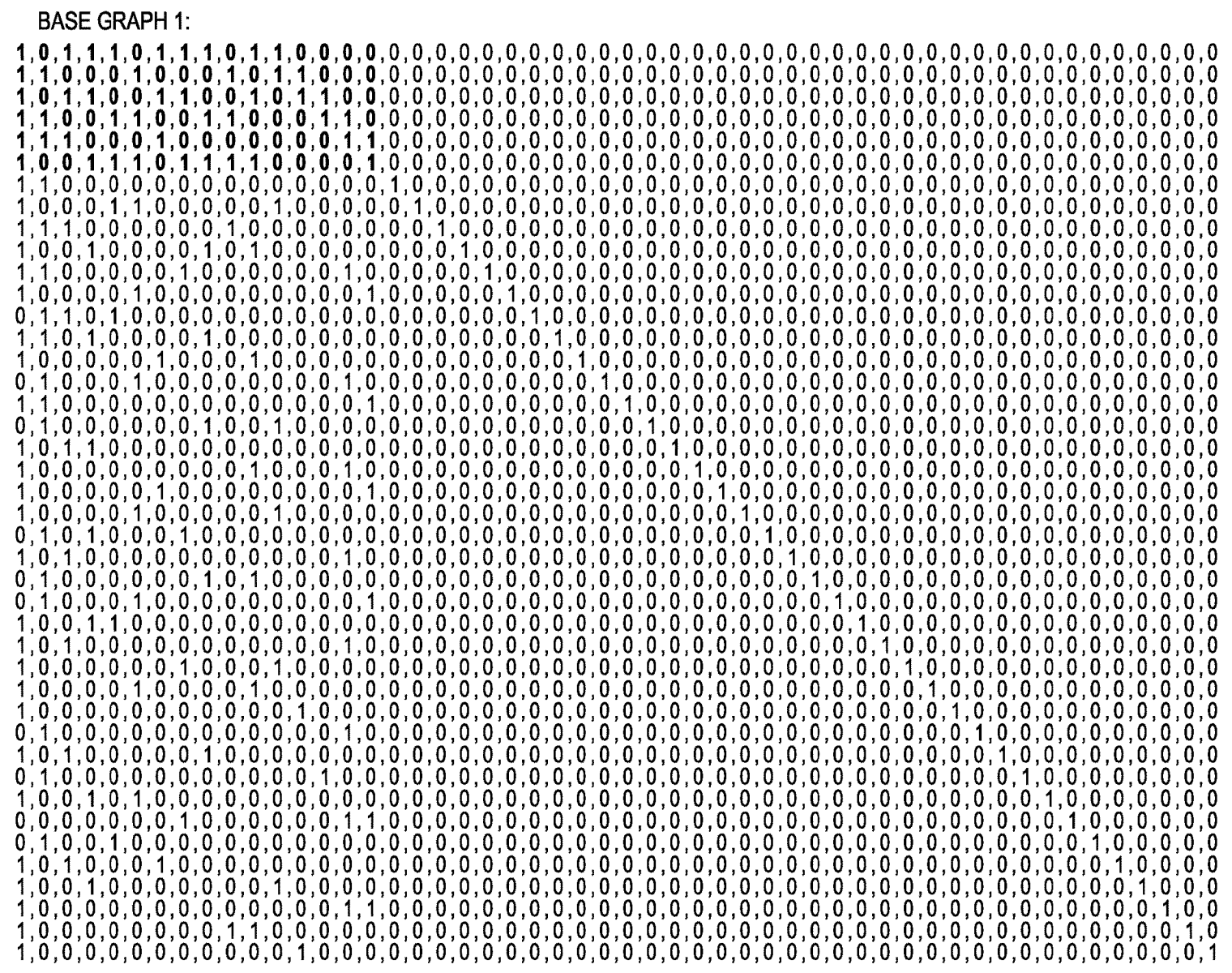
Figure 3B:
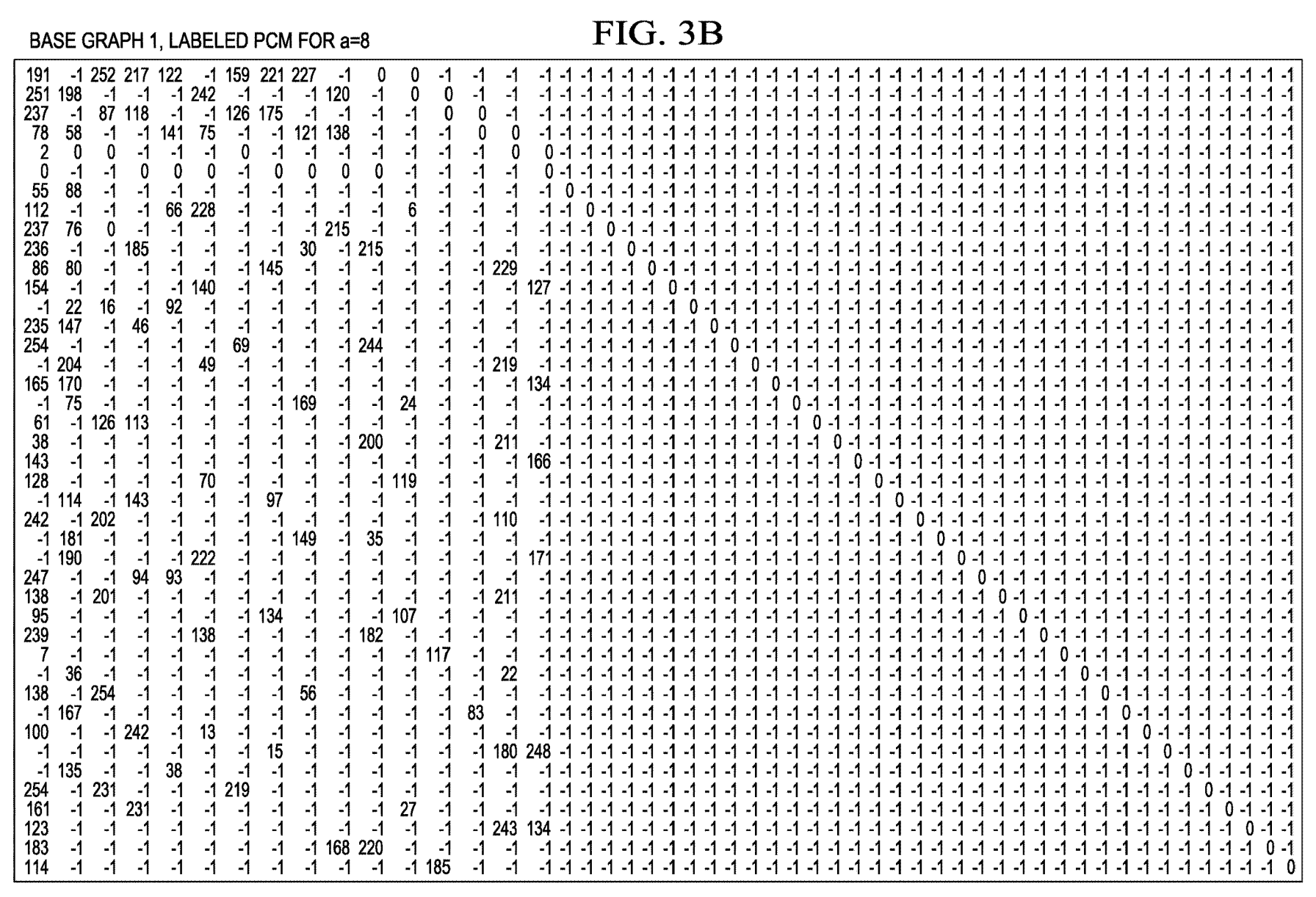

A first embodiment of a first base graph/matrix is disclosed in FIG. 3A. The first base graph/matrix includes a 16×6 core matrix, an extension part and an identity matrix. The core matrix (210) includes two punctured information columns (columns 1-2 (231)), a core part 211 (9 information columns (columns 3-11)) and a double diagonal structure 280 (columns 12-16). The base graph/matrix includes an extension part (220) with punctured information columns, information columns and identity matrix columns.

A first advantageous feature of the first base graph is that it is orthogonal in the core matrix 210 of the graph and therefore conflict free except for the punctured information columns 231 and the double diagonal parity check columns 280. A conflict may occur when two adjacent rows have vertically two ones next to each other. As can be seen from FIG. 3A this is only true for the two punctured information columns 231 and double diagonal parity check columns 280 in the core part of the graph.

For example, as can be seen from FIGS. 2 and 3A, the core part 211 of the first base graph without the punctured information columns 231 and the double diagonal parity columns 280 is defined as follows (columns 3-11):

$$CMBG_1 = \begin{pmatrix} 1 & 1 & 1 & 0 & 1 & 1 & 1 & 0 & 1 \\ 0 & 0 & 0 & 1 & 0 & 0 & 0 & 1 & 0 \\ 1 & 1 & 0 & 0 & 1 & 1 & 0 & 0 & 1 \\ 0 & 0 & 1 & 1 & 0 & 0 & 1 & 1 & 0 \\ 1 & 0 & 0 & 0 & 1 & 0 & 0 & 0 & 0 \\ 0 & 1 & 1 & 1 & 0 & 1 & 1 & 1 & 1 \end{pmatrix}.$$

A second advantageous feature of the first base graph is that it is orthogonal in the extension part 220 except for the punctured information columns 240. As can be seen from FIG. 3A no two adjacent rows have two vertical adjacent ones but either a one and a zero or a zero and a zero.

A third advantageous feature of the first base graph is that for each two adjacent rows in the punctured information columns 240 in the extension part 220 only one conflict occurs.

Figure 4A:
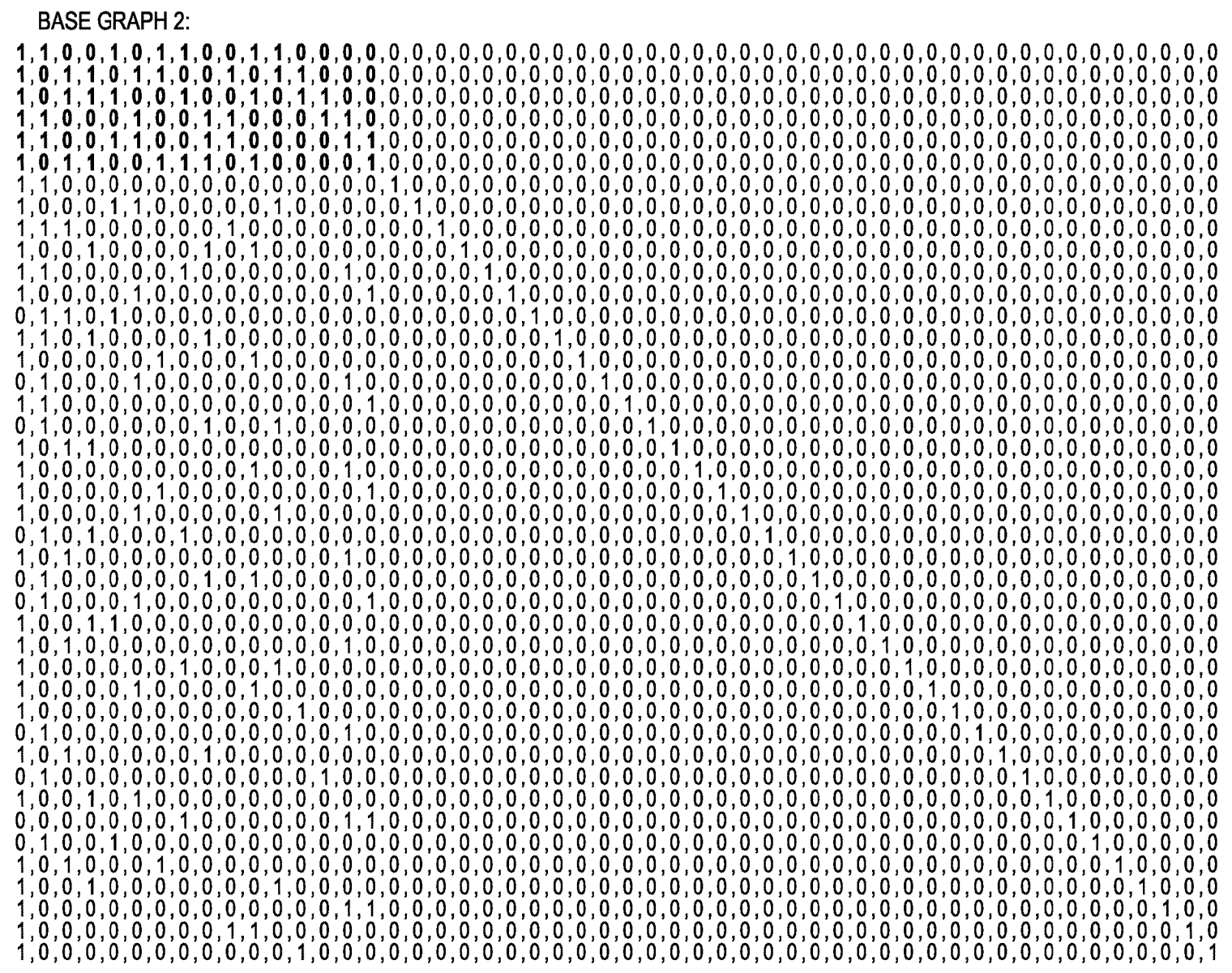
Figure 4B:
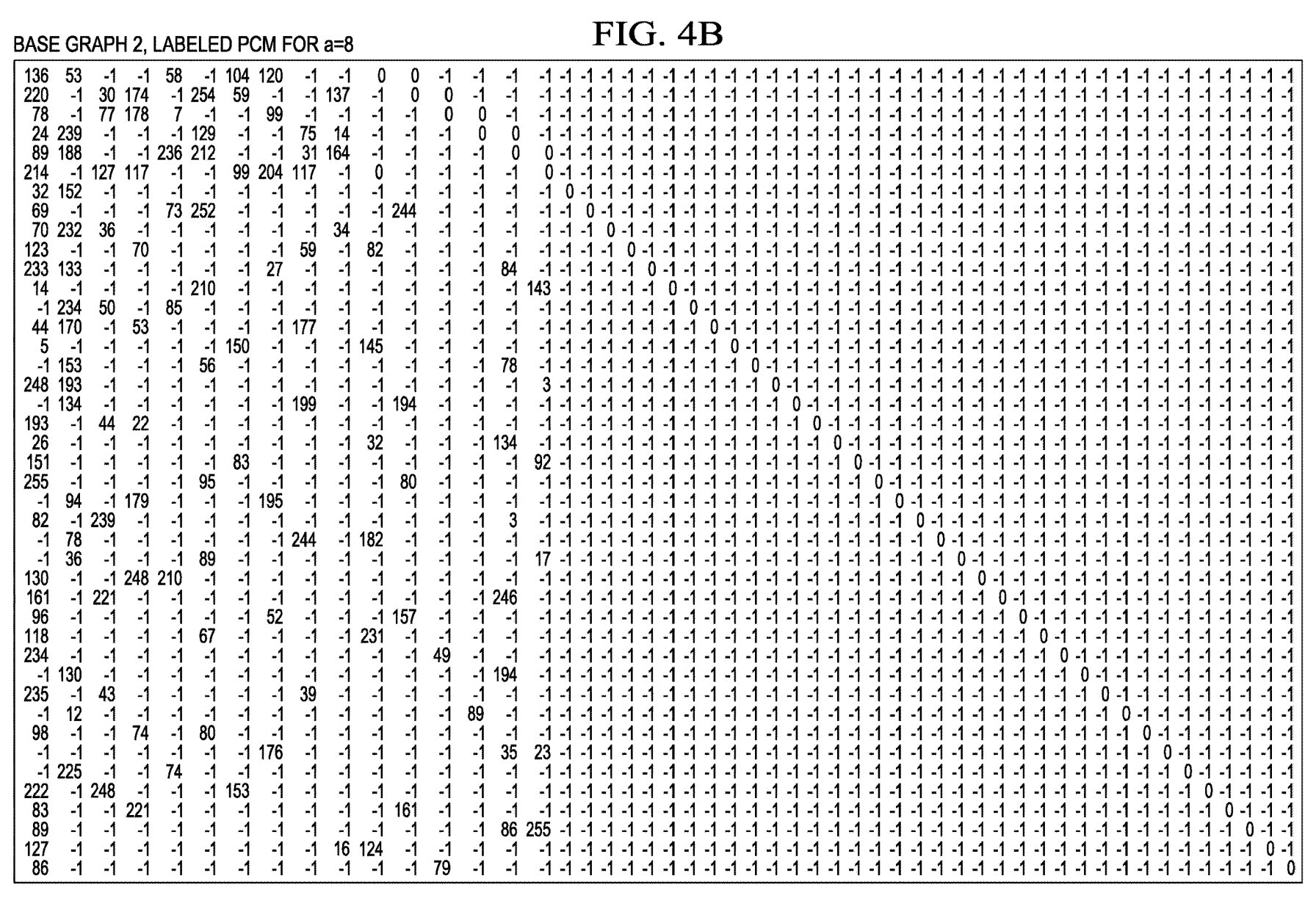

A second embodiment of a second base graph/matrix is disclosed in FIGS. 2 and 4A. The second base graph/matrix includes a 16×6 core matrix, an extension part and an identity matrix. The core matrix 210 includes two punctured information columns 231 (columns 1-2), a core part 211 (9 information columns (columns 3-11)) and a double diagonal structure 280 (columns 12-16). The base graph/matrix includes an extension part 220 with two punctured information columns, 9 information columns (columns 3-11) and identity matrix columns.

A first advantageous feature of the second base graph is that its core matrix 210 is almost conflict free except for a number of limited instances.

For example, as can be seen from FIGS. 2 and 4A, the core part 211 of the second base graph without the punctured information columns 231 and the double diagonal parity columns 280 is defined as follows (columns 3-11):

$$CMBG_2 = \begin{pmatrix} 0 & 0 & 1 & 0 & 1 & 1 & 0 & 0 & 1 \\ 1 & 1 & 0 & 1 & 1 & 0 & 0 & 1 & 0 \\ 1 & 1 & 1 & 0 & 0 & 1 & 0 & 0 & 1 \\ 0 & 0 & 0 & 1 & 0 & 0 & 1 & 1 & 0 \\ 0 & 0 & 1 & 1 & 0 & 0 & 1 & 1 & 0 \\ 1 & 1 & 0 & 0 & 1 & 1 & 1 & 0 & 1 \end{pmatrix}.$$

A second advantageous feature of the second base graph is that it is orthogonal in the extension part 220 except for the punctured information columns 240. As can be seen from FIG. 4A no two adjacent rows have two vertical adjacent ones but either a one and a zero or a zero and a zero.

A third advantageous feature of the second base graph is that for each two adjacent rows in the punctured information columns 240 in the extension part 220 only one conflict occurs.

Embodiments of the disclosure include base graphs of different sizes and different sized core matrices. The core matrices may be orthogonal or quasi orthogonal. The extension parts of the base graphs may be orthogonal except for the punctured information columns. The punctured information columns may have only one conflict per two adjacent rows, i.e., ones in vertical adjacent positions.

Figure 3C:
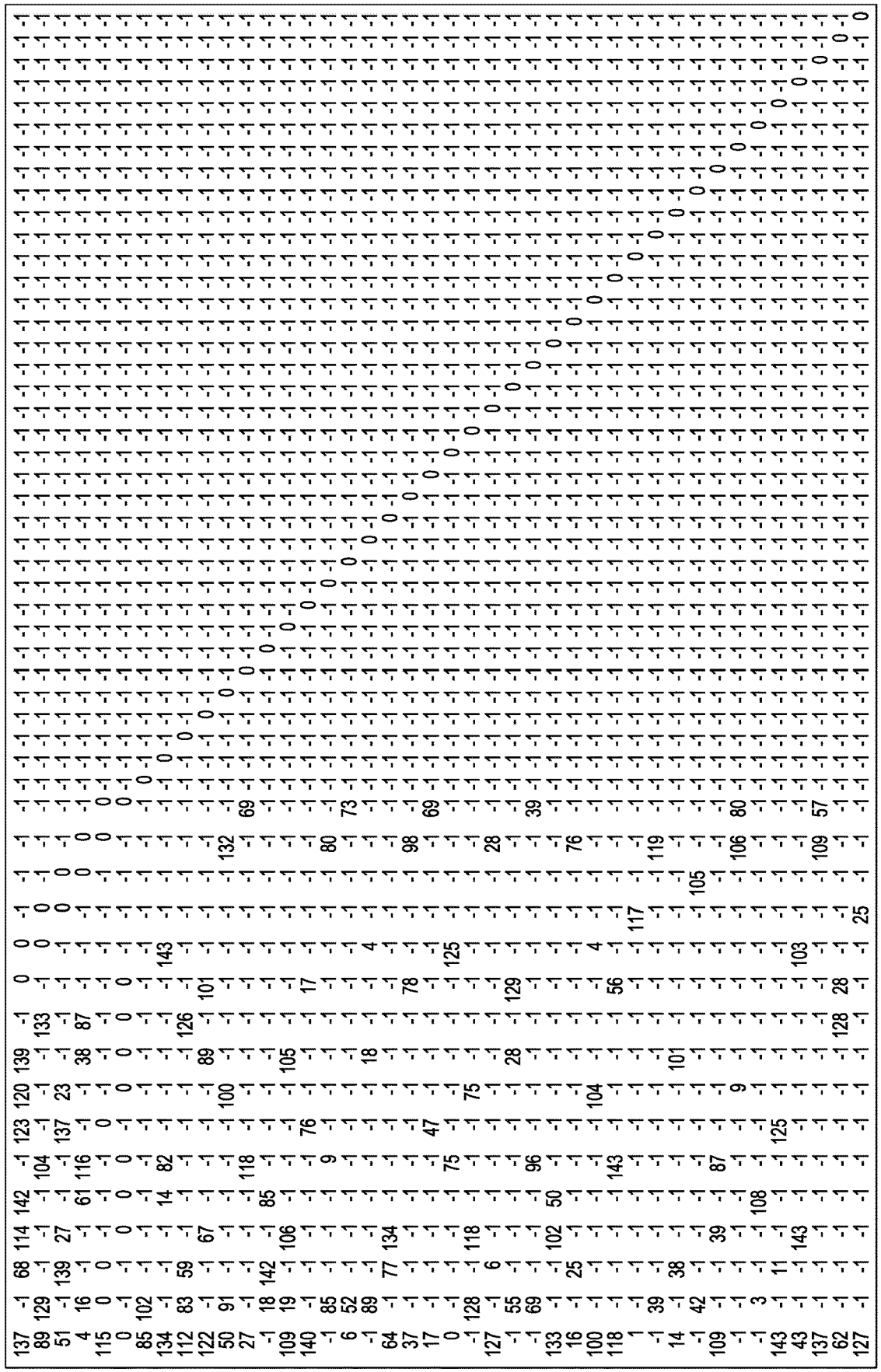
Figure 3E:
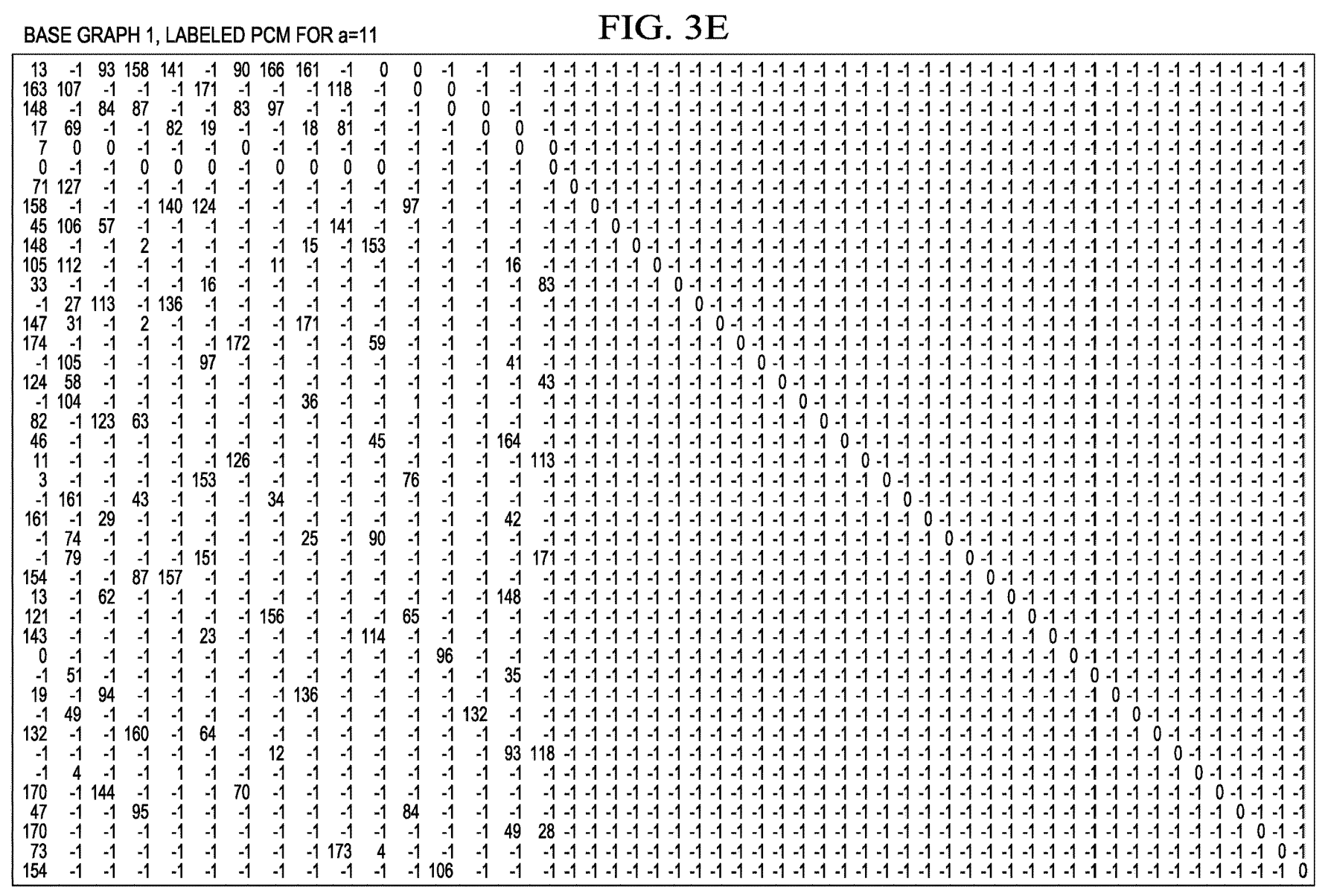
Figure 3F:
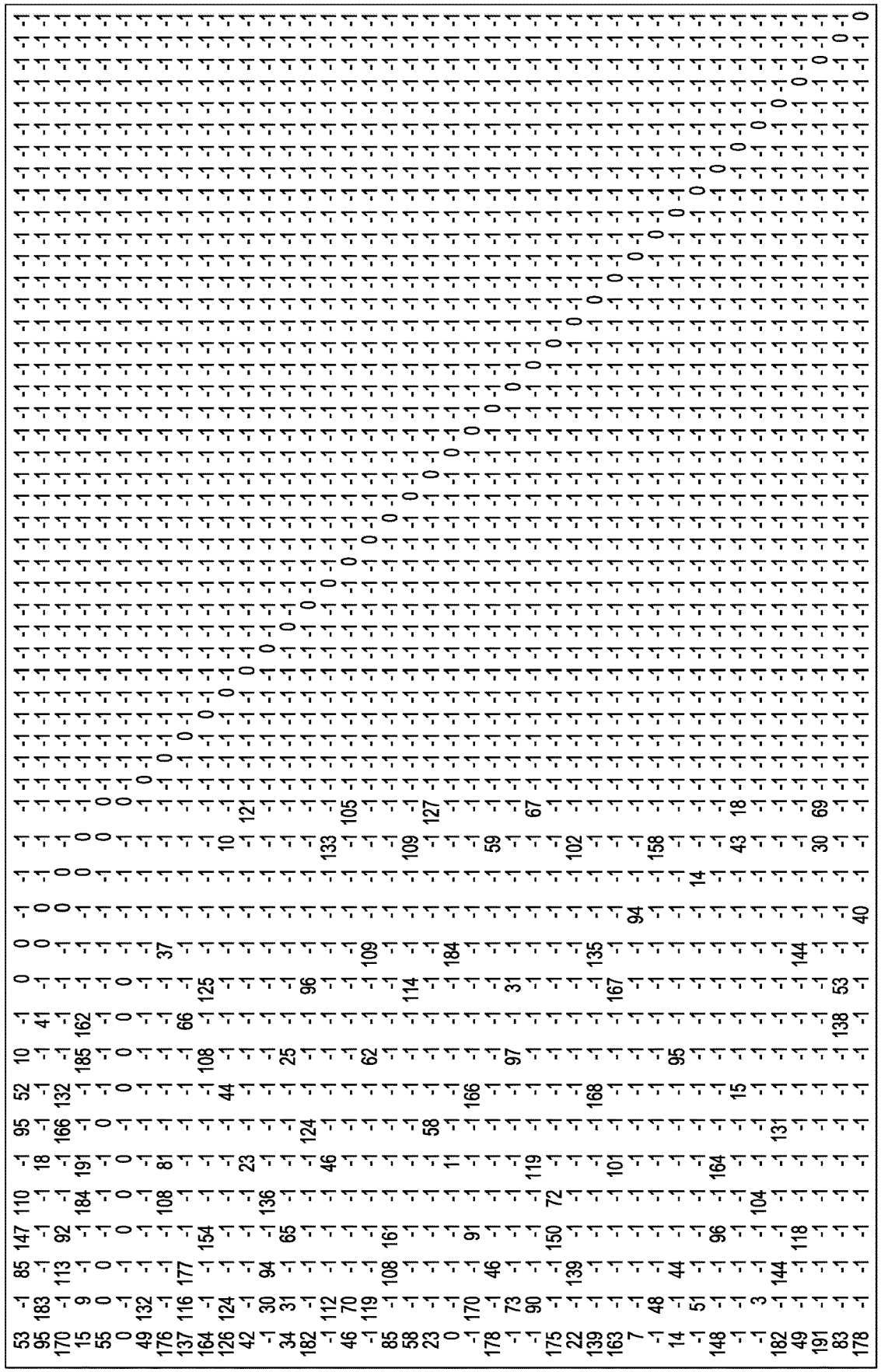
Figure 3G:
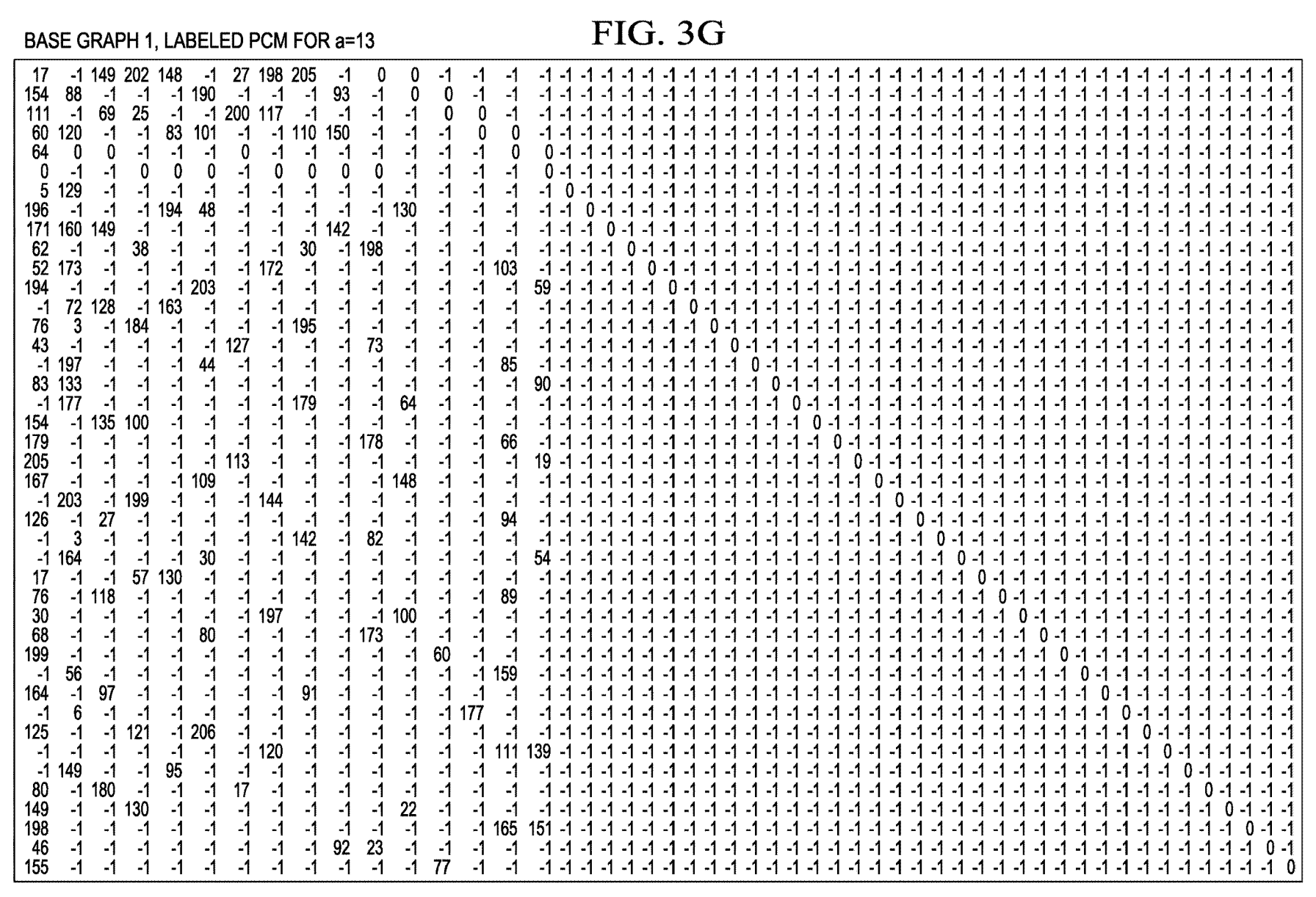
Figure 3H:
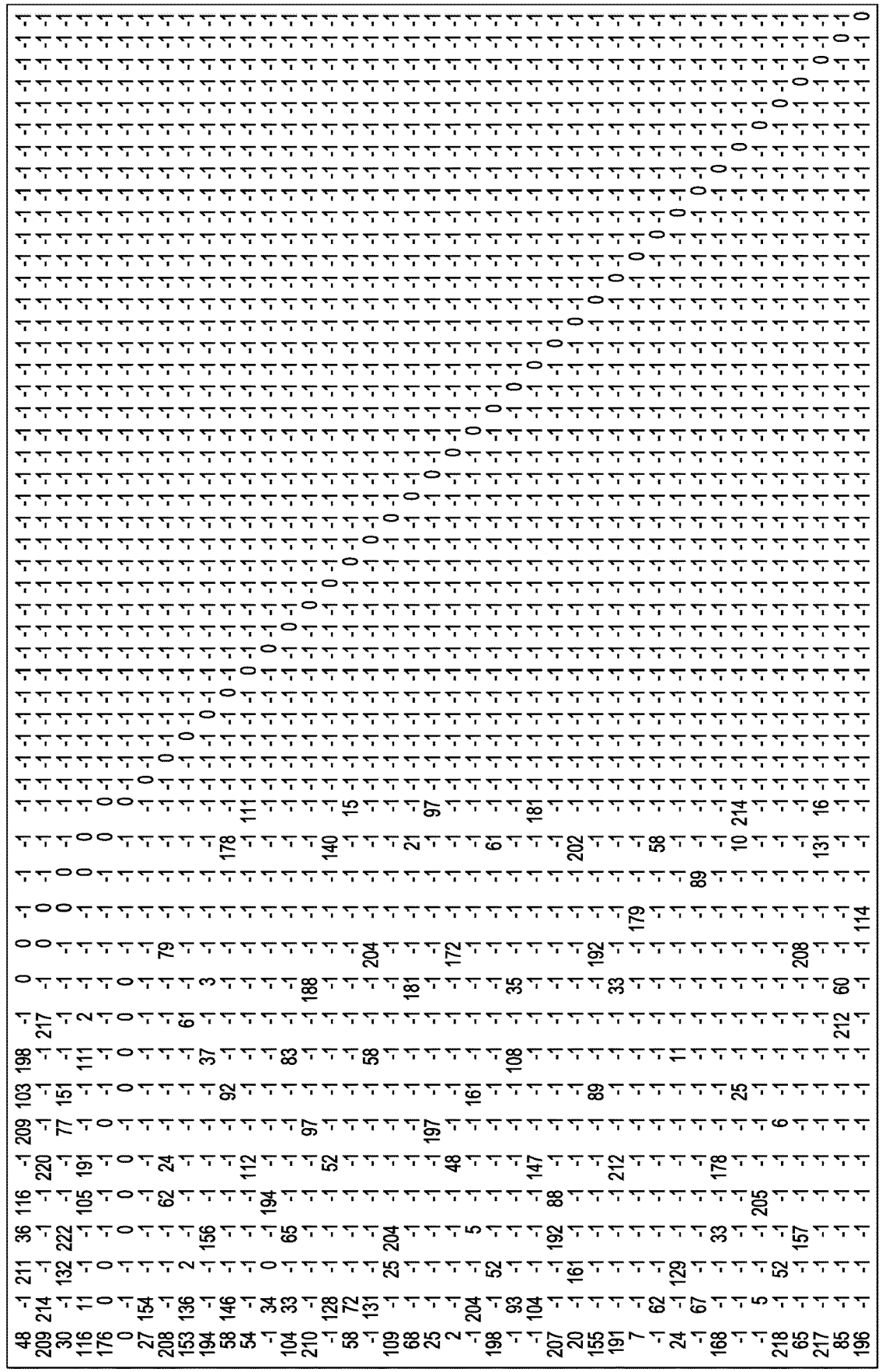
Figure 3I:
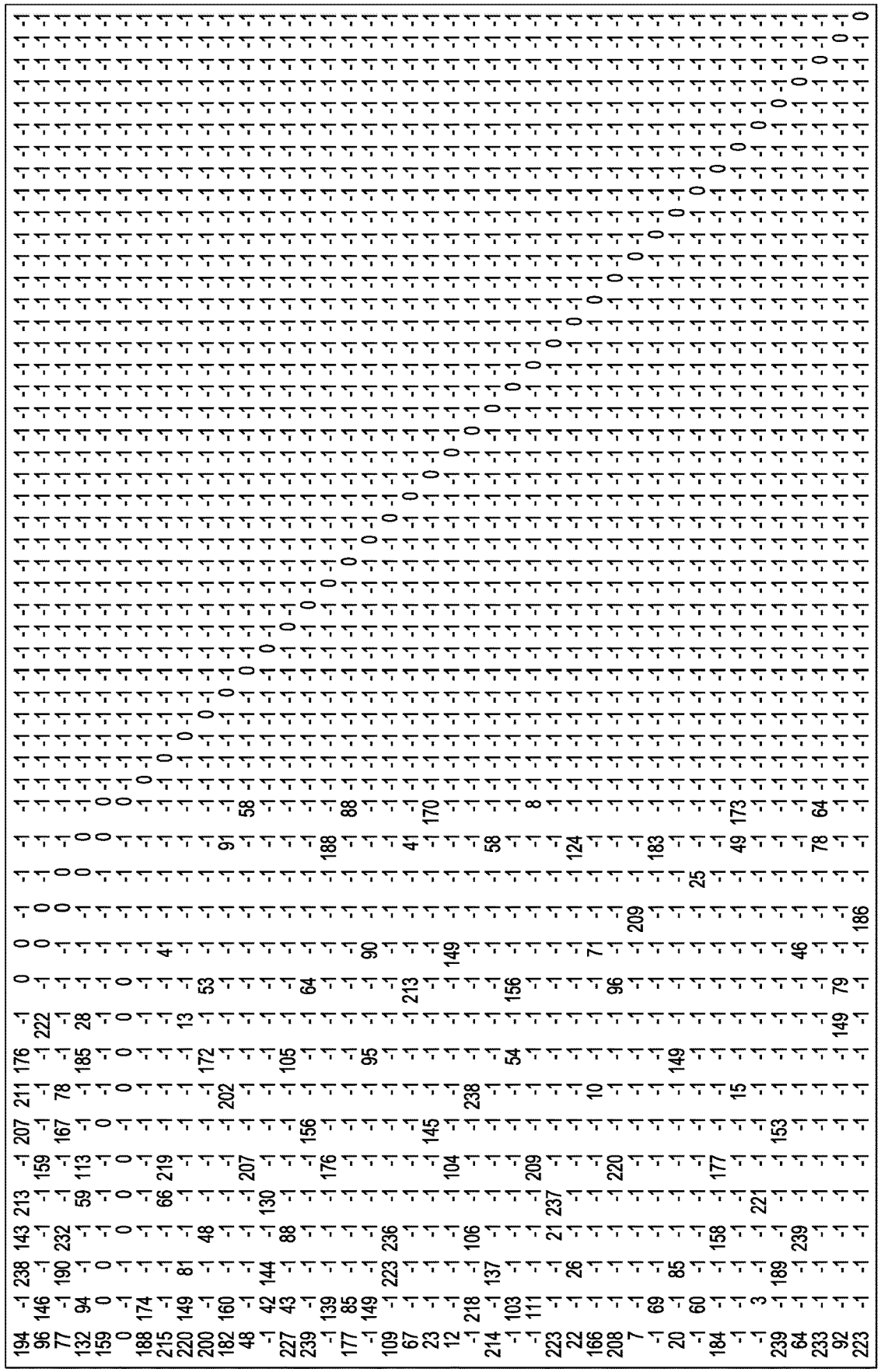
Figure 4C:
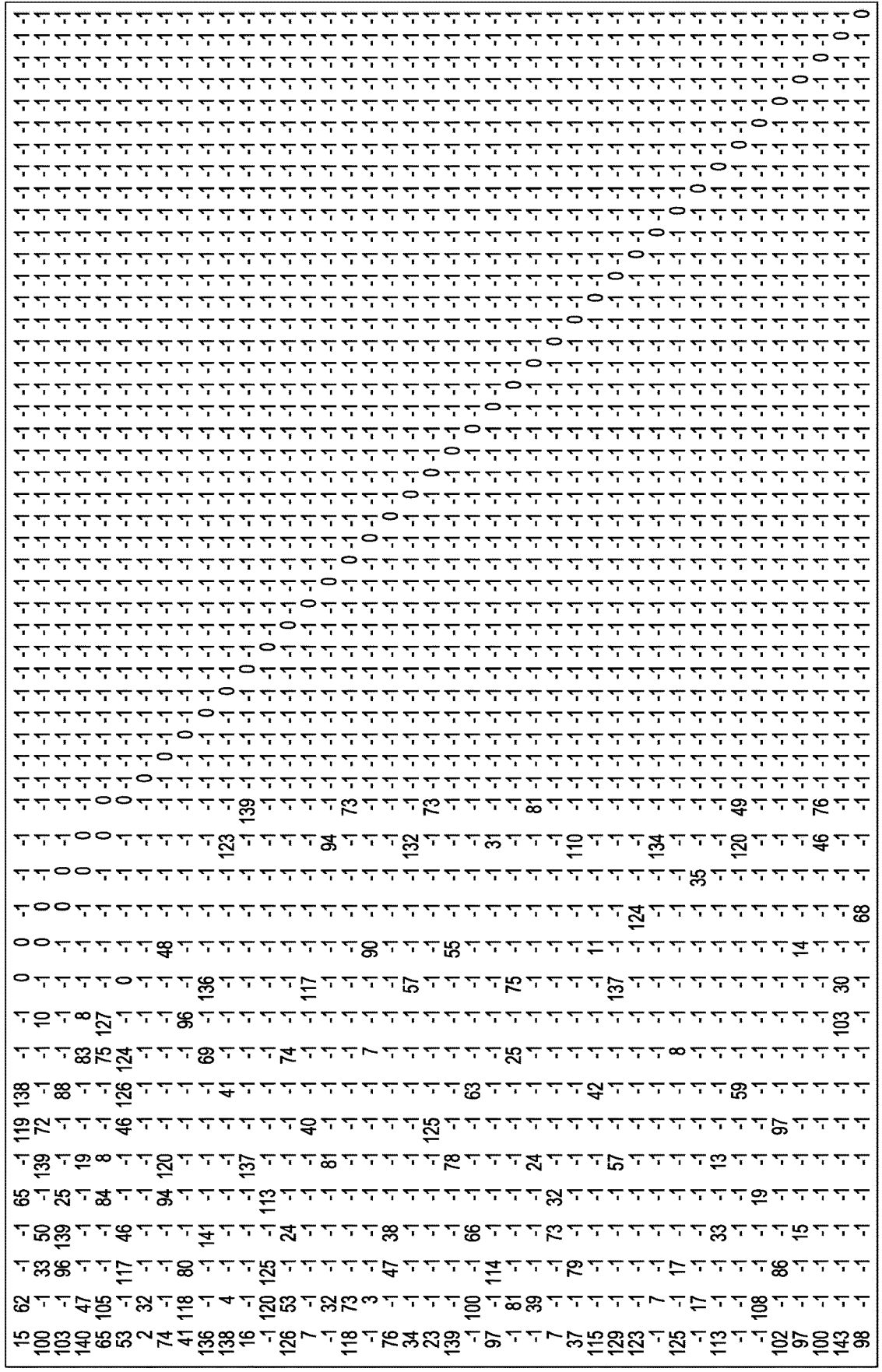
Figure 4D:
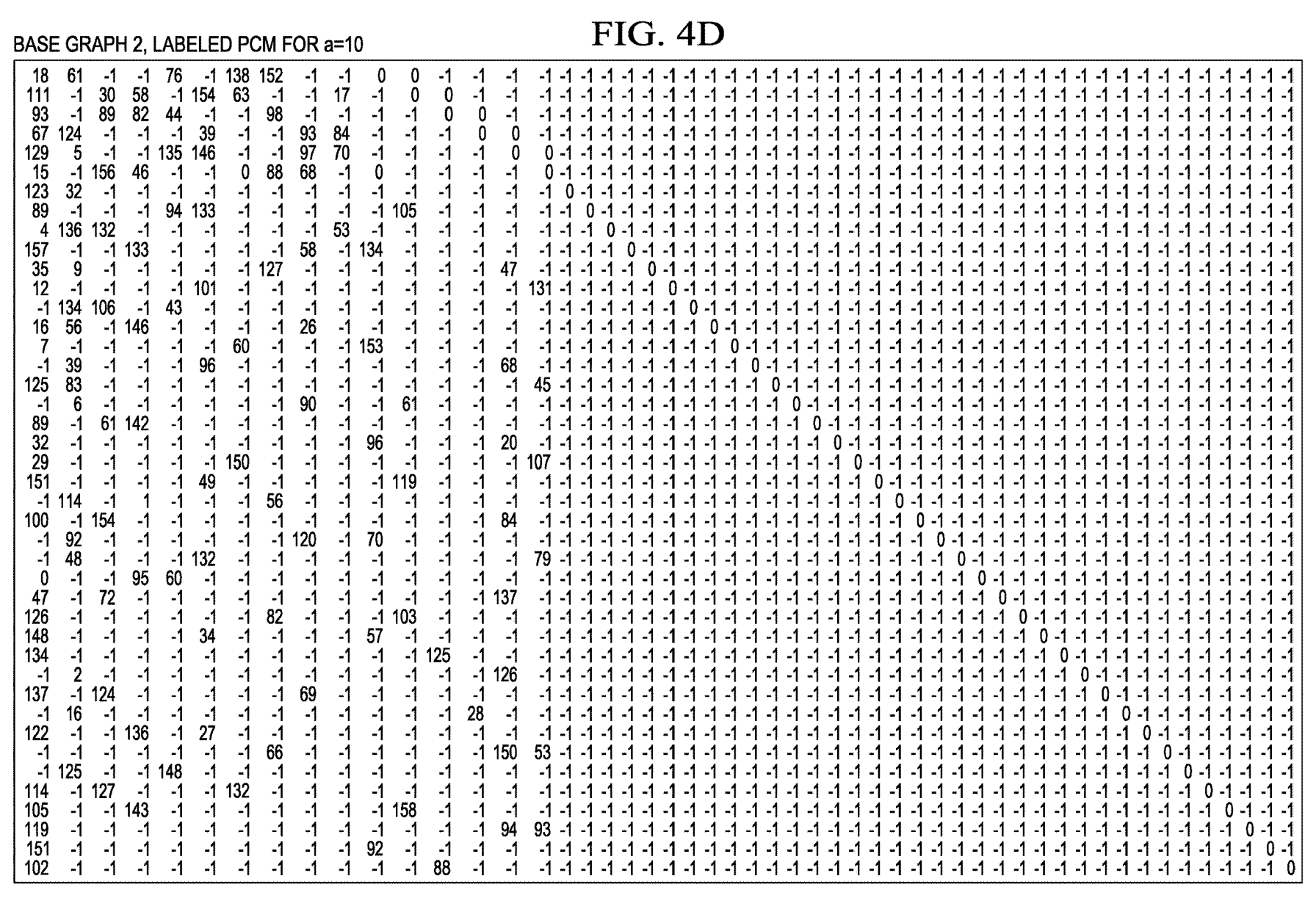
Figure 4E:
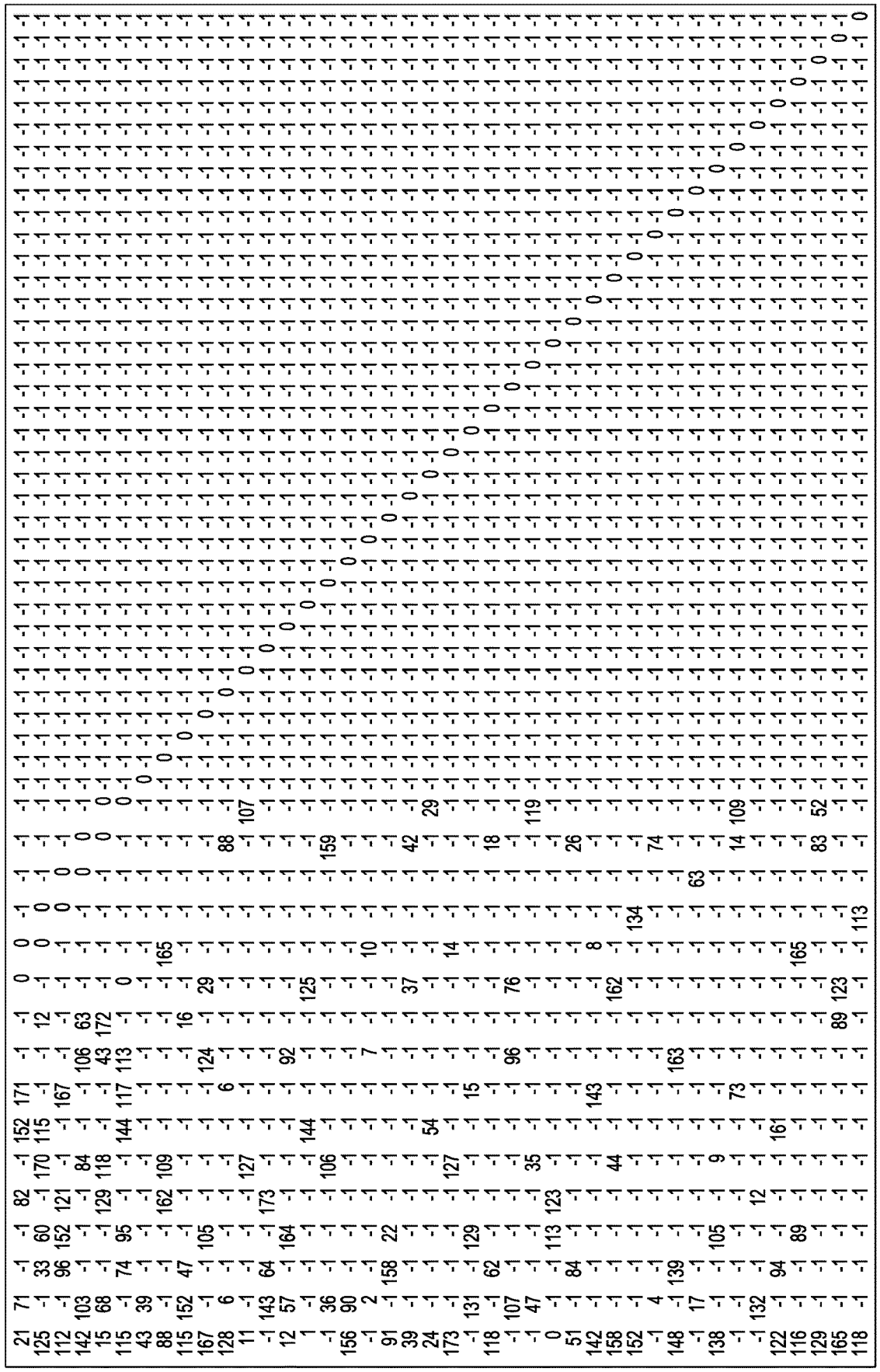
Figure 4F:
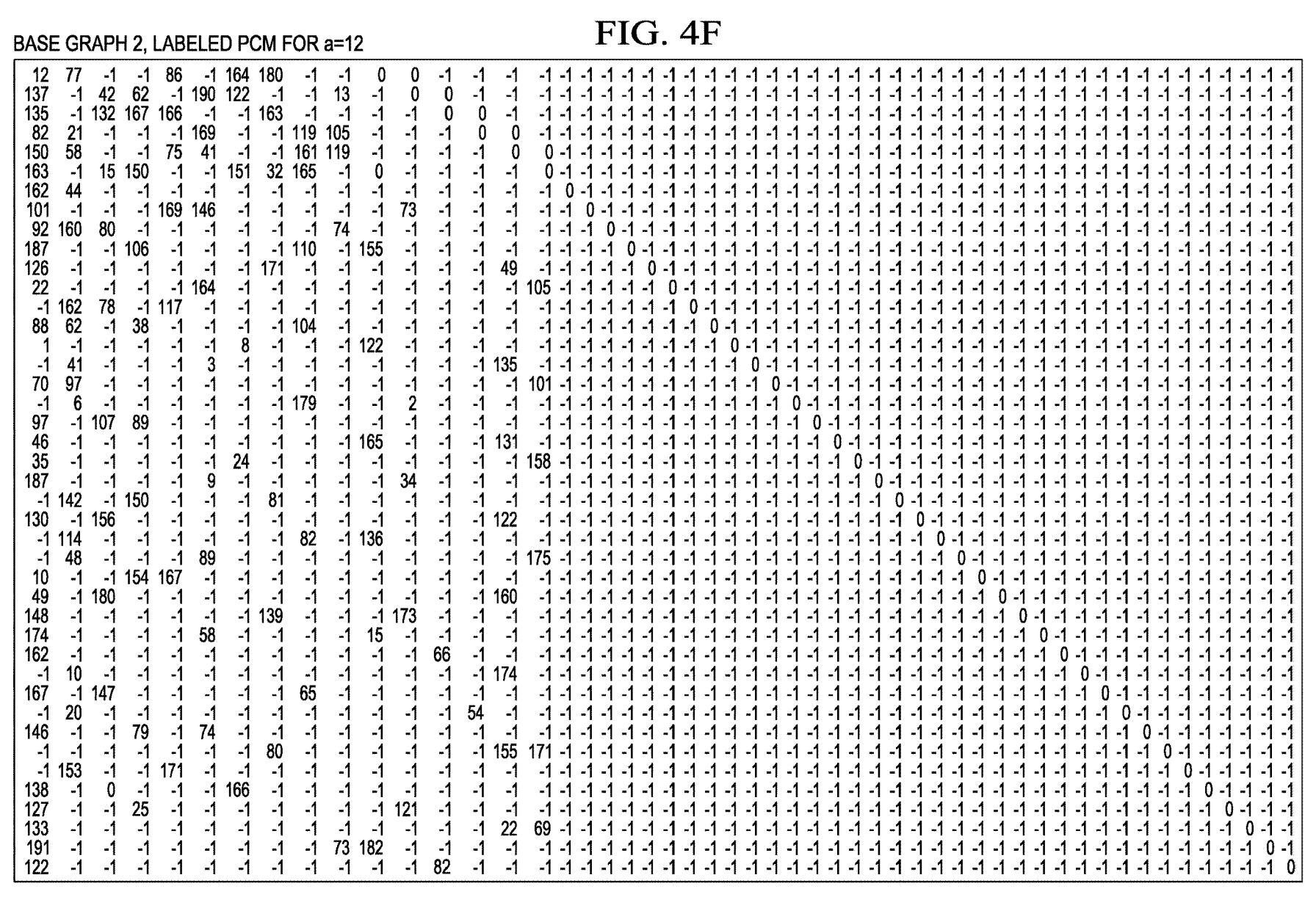
Figure 4G:
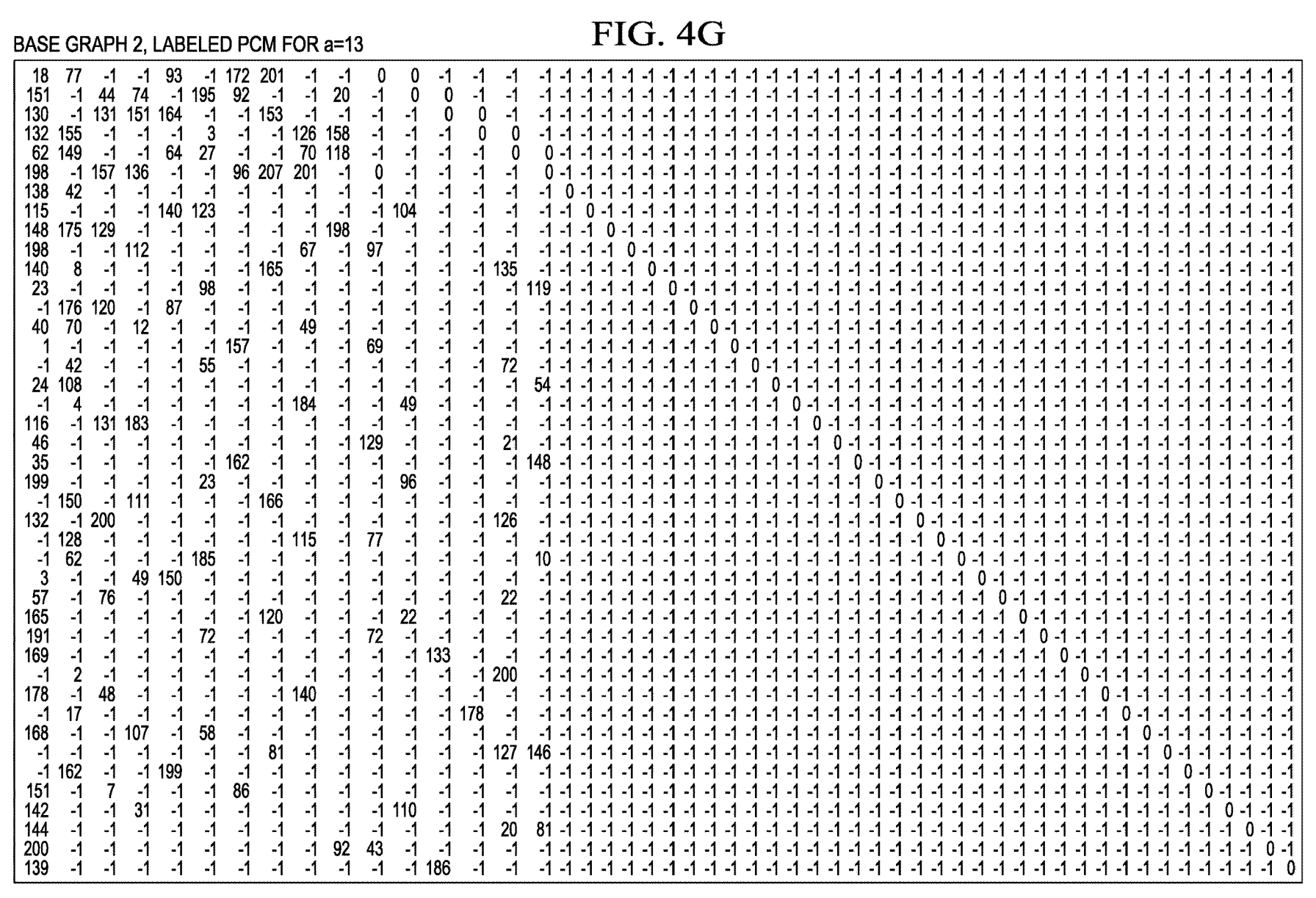
Figure 4H:
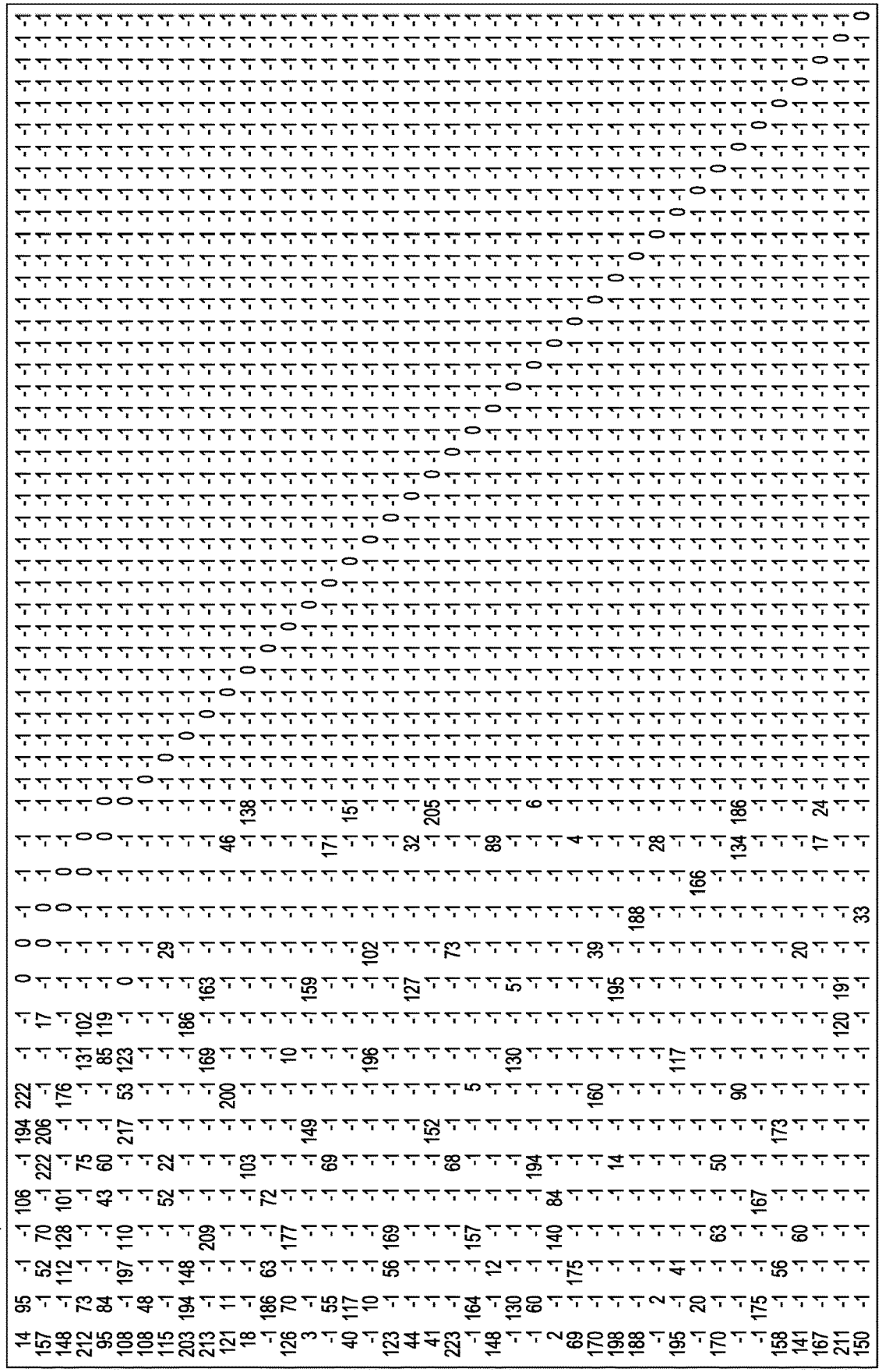
Figure 4I:
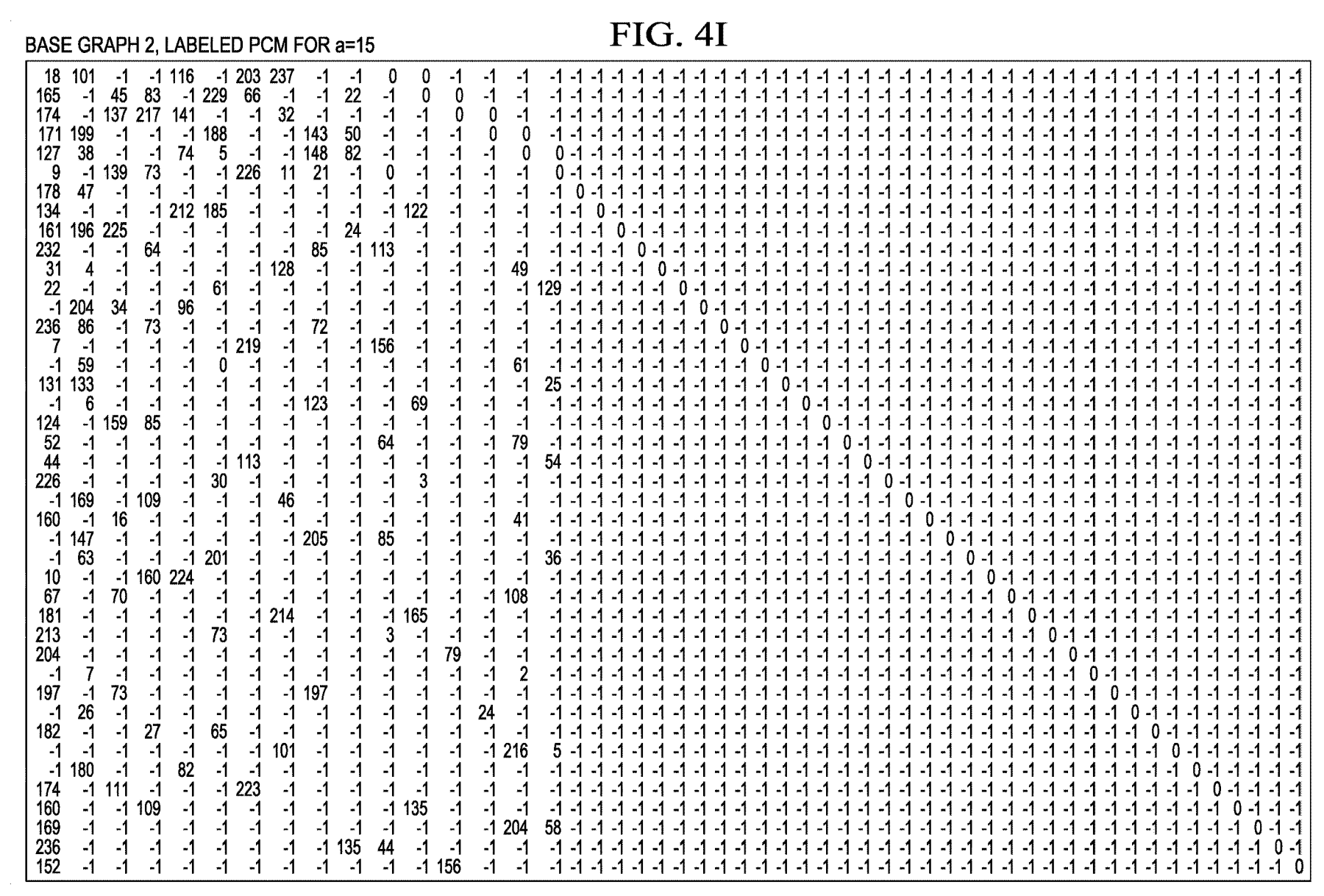

Embodiments of the disclosure provide lifted base graphs. Lifted base graphs for base graph illustrated in FIG. 3A are illustrated in FIGS. 3B-3I and lifted base graphs for base graph illustrated in FIG. 4A are illustrated in FIGS. 4B-4I. The first and second base graphs (FIGS. 3A and 4A) are lifted according to the procedure disclosed in patent application Ser. No. 15/968,597, filed on May 1, 2018, and titled "Multi-Label Offset Lifting Method". This patent application is incorporated herein by reference in its entirety. The first and second base graphs are lifted according to different lifting sizes Z, wherein $Z=a*2^s$, and wherein a=8, 9, . . . , 15 and s is a constant. The different lifting sizes generate the different labeled matrices illustrated in FIGS. 3B-3I and 4B-4I).

Figure 5A:
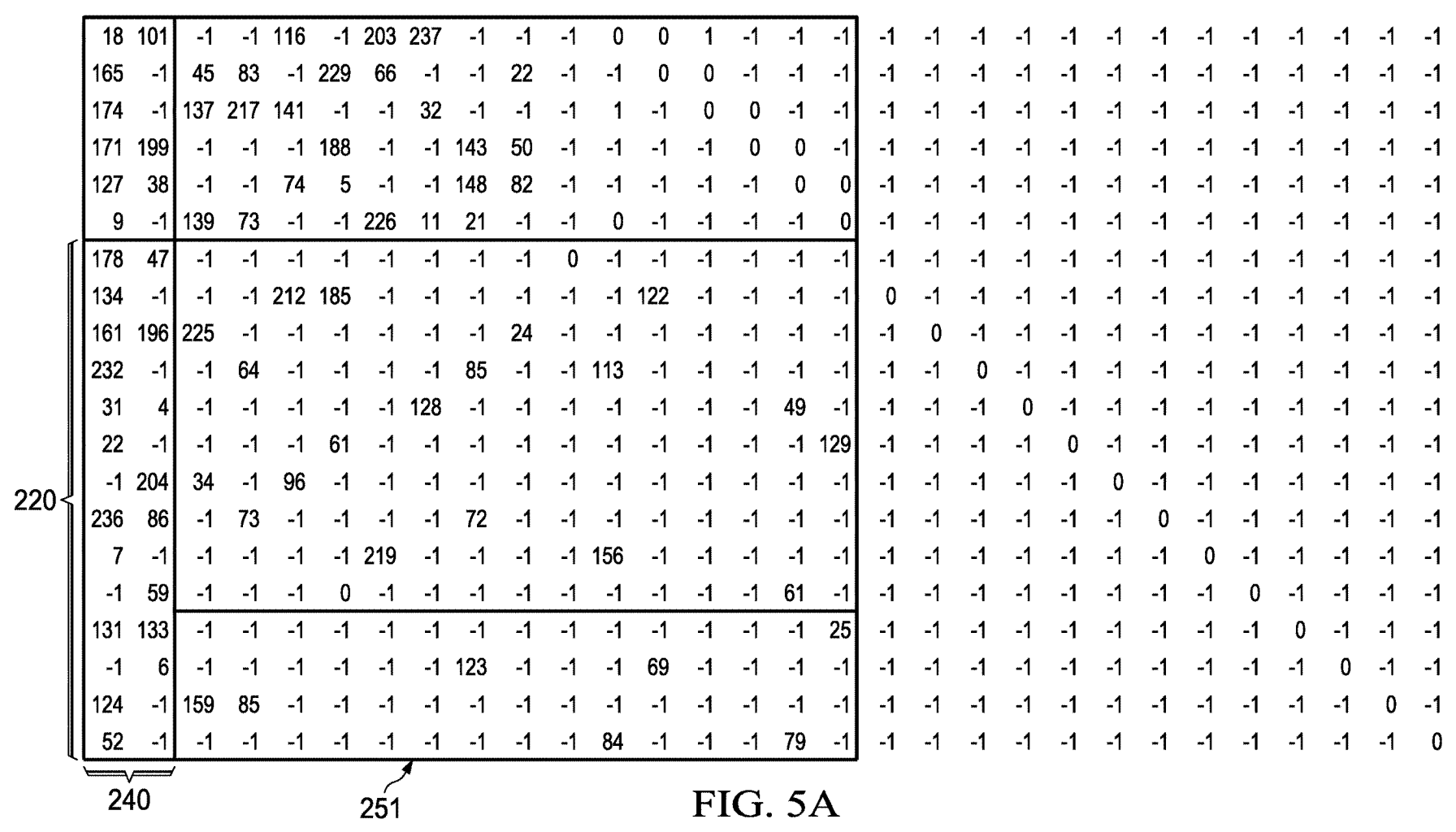

The embodiment labeled matrices (FIGS. 3B-3I and 4B-4I) reduce conflicts when processed in a decoder when each n adjacent rows, n>1 in an extension part of each matrix (in particular the information columns) are orthogonal except for the punctured information columns. For example, FIG. 5A shows a detail of the embodiment labeled matrix of base graph 2 for a=15. Here, a group of 4 adjacent rows 251 in the extension part 220 of the labeled PCM is orthogonal (except for columns 1 and 2 which are punctured information columns 240). These respective rows do not provide a conflict because adjacent vertical cells are populated with negative ones (or are empty). This may be true for all or only for some groups of 4 adjacent rows in the extension part 220 of the labeled PCM. Alternatively, a group of adjacent rows may include 2, 3, 4, 5, 6, 8, etc. orthogonal rows. This is true for all labeled matrices (FIGS. 3B-3I and 4B-4I) of the first and second base graphs. The embodiment labeled matrices (e.g., PCMs) processed by a decoder advantageously reduce or avoid memory read-write conflicts in the hardware implementation of the decoder.

Figure 5B:
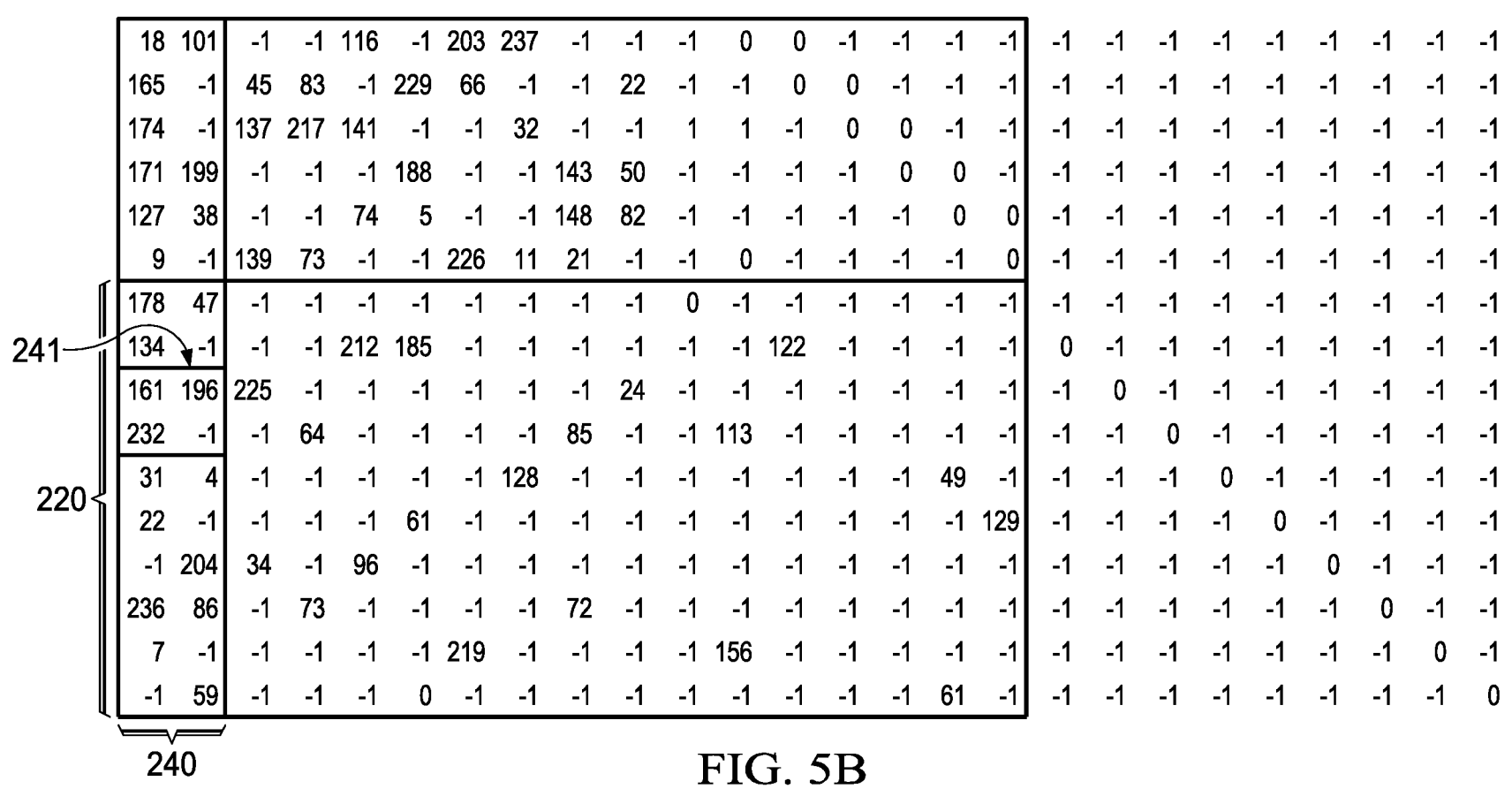

The embodiment labeled matrices (FIGS. 3B-3I and 4B-4I) reduce conflicts when processed in a decoder when two adjacent rows 241 in the punctured information columns 240 in the extension part 220 do not have more than 1 conflict per adjacent rows. In other words, every two adjacent rows in the punctured information columns 240 have not more than one conflict. For example, FIG. 5B shows a detail of the embodiment labeled PCM of base graph 2 for a=15. Here, the labeled PCM has a conflict in the first information column for two adjacent rows 161/232 but not in the second information column 196/−1. This is true for every 2 adjacent rows or only for some of the 2 adjacent rows in the punctured information columns 240. This advantageously helps to reduce the complexity of the decoder, in particular, the hardware implementation of the shifters.

Figure 5C:
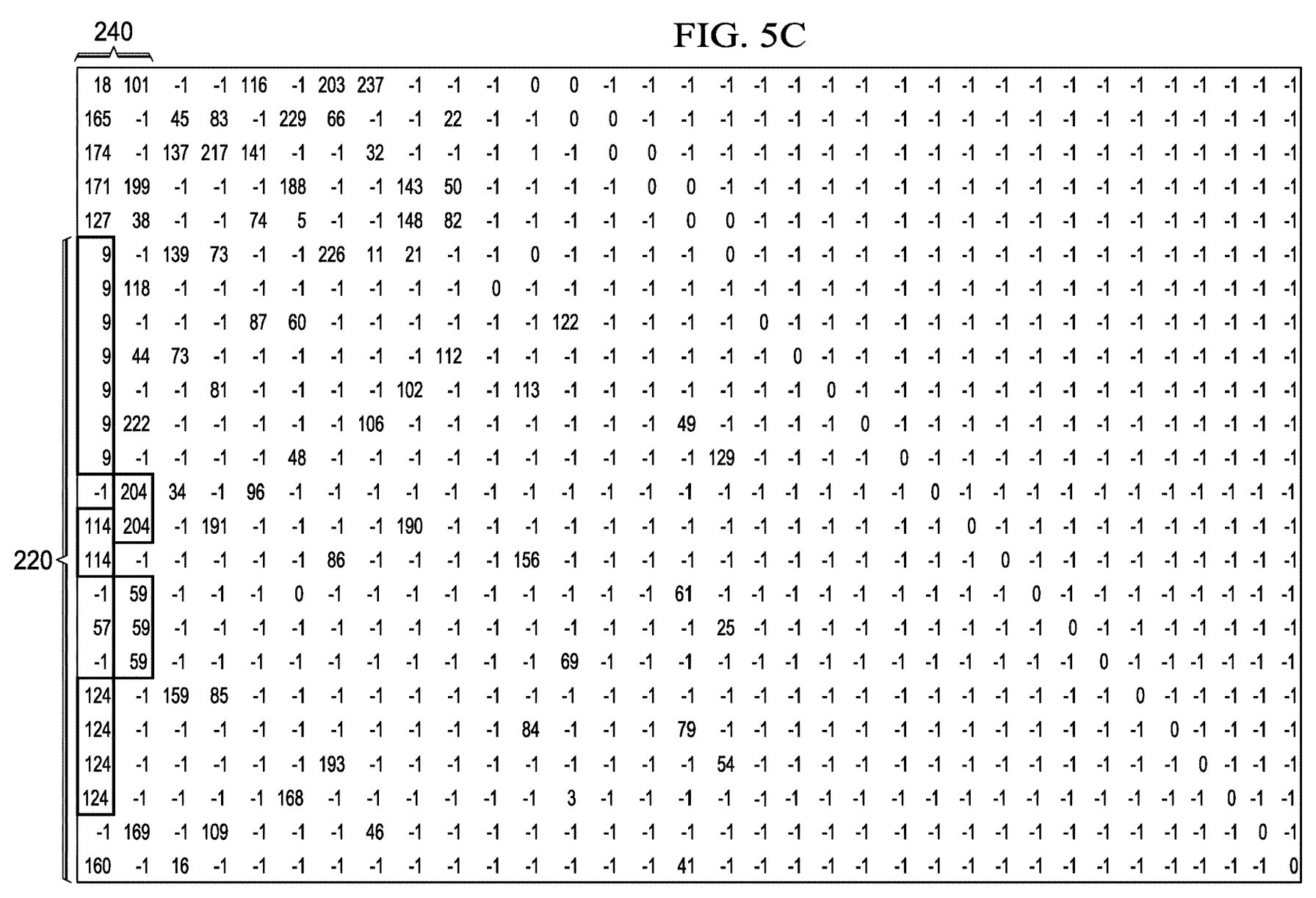

Further embodiments reduce conflicts when processed in a decoder when conflicts in the punctured information columns are shifted so that the shifts of vertical cells having a conflict are equal. This is illustrated in FIG. 5C. By making the shifts of adjacent vertical cells having a conflict equal makes the hardware implementation of the decoder simpler because it allows a single-shifter processing these columns in the CNUs. The first column in the punctured information columns 240 of the extension part 220 may comprise a first plurality of adjacent non-empty cells (two or more) and a second plurality of adjacent non-empty cells (two or more), wherein the first plurality and the second plurality are not adjacent. The first plurality of adjacent non-empty cells may all include the same first shift size (e.g., 9) and the second plurality of adjacent non-empty cells may all include the same second shift size (e.g., 124), wherein the first and second shift sizes are the same or are different. The same may be true for the second column in the punctured information columns (e.g., 204 and 59).

Figures 5D, 5E:
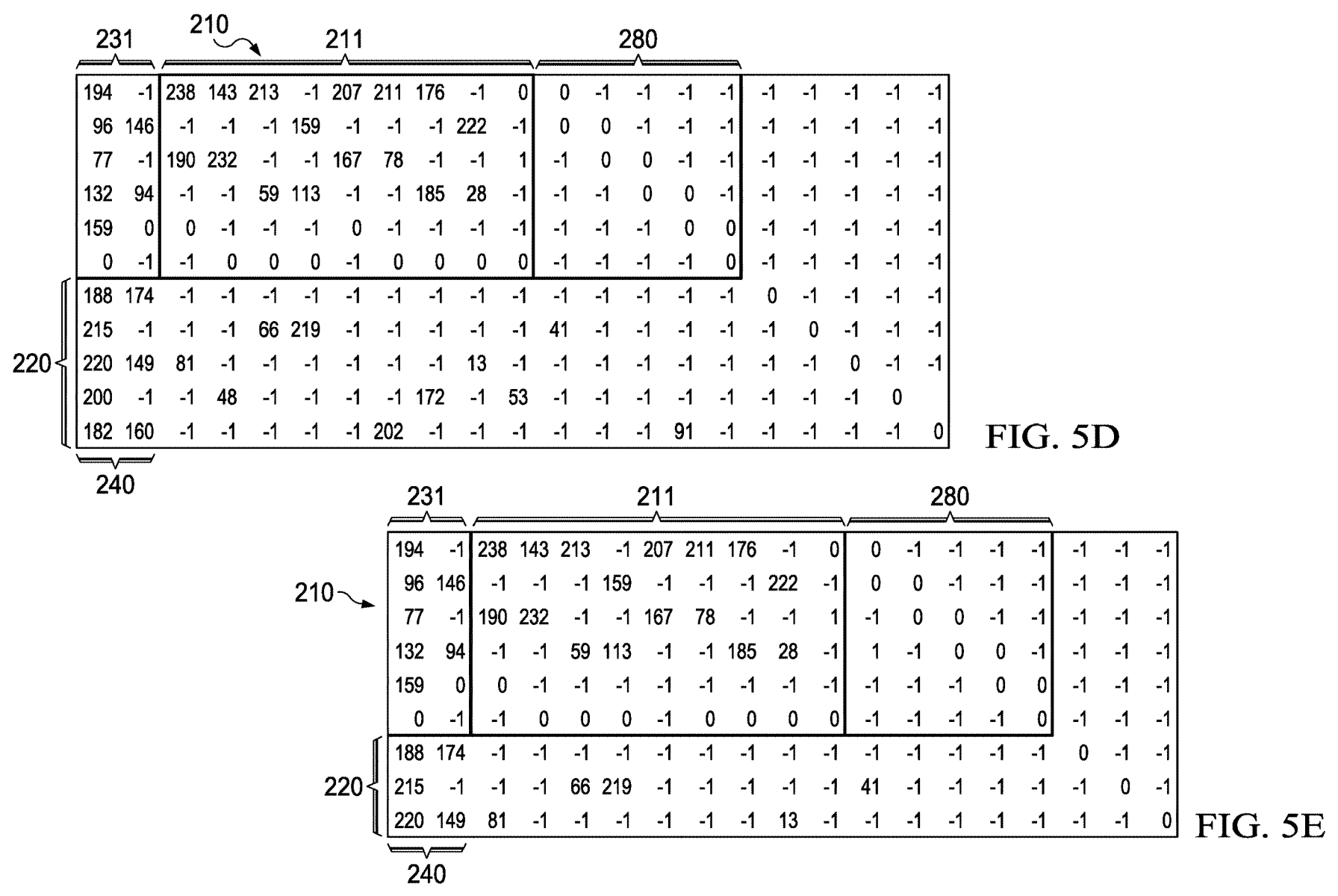

As discussed above the first base graph (FIG. 3A) has a core matrix 210 that is orthogonal except in the punctured information columns 240 and double diagonal parity columns 280. Each two adjacent rows are orthogonal and the information part 220 of the core matrix is quasi orthogonal (because of the punctured information columns). A detail of a lifted first base graph (FIG. 3I) is shown in FIG. 5D. Similarly, the information part 211 (including the punctured information columns 231) of the core matrix 210 of the lifted first base graph is quasi orthogonal and the core matrix 210 of the first lifted base graph without the punctured information columns 231 and double diagonal parity check columns 280 is orthogonal because each two adjacent rows are orthogonal (and therefore has no conflict). The core matrix 210 of this particular first lifted base graph is the lifted matrix without the extension part 220 and the parity matrix 260.

Moreover, the two last orthogonal rows in the core matrix 210 of this particular first lifted base graph comprise shifts equal to zeros (including the punctured information columns). This is shown in FIG. 5E. This allows an efficient hardware implementation of the decoder because it allows a single-shifter processing these columns in the CNUs.

FIG. 6 shows a table with different nested codes from different providers. The table compares the two disclosed base graphs (FIGS. 3A and 4A) with other published base graphs. The second row from the top represents the complexity of the two disclosed base graphs. The calculation is done for different rates and by only taking into account the number of non-zero cells in the base graphs (decoder does not spend any time processing empty cells) i.e., without the special features disclosed in the present application. As can be seen from FIG. 6, the first and second base graphs are less or equally complex than the other codes and this is even true without the features discussed with respect to FIGS. 5A-5E. Accordingly, by further taking into account the disclosed features the first and second base graphs are even less complex which means that they can be very efficiently processed by a decoder.

FIGS. 7A and 7B show the performance of the first base graph for block error rate (BLER)=1 $e^{-2}$ and BLER=1 $e^{-4}$ for different rates. As can be seen the graphs are smooth and do not have any significant spikes for both BLER levels. This means that the first base graph has good rate and length adaption for all standard rates.

Figure 8:
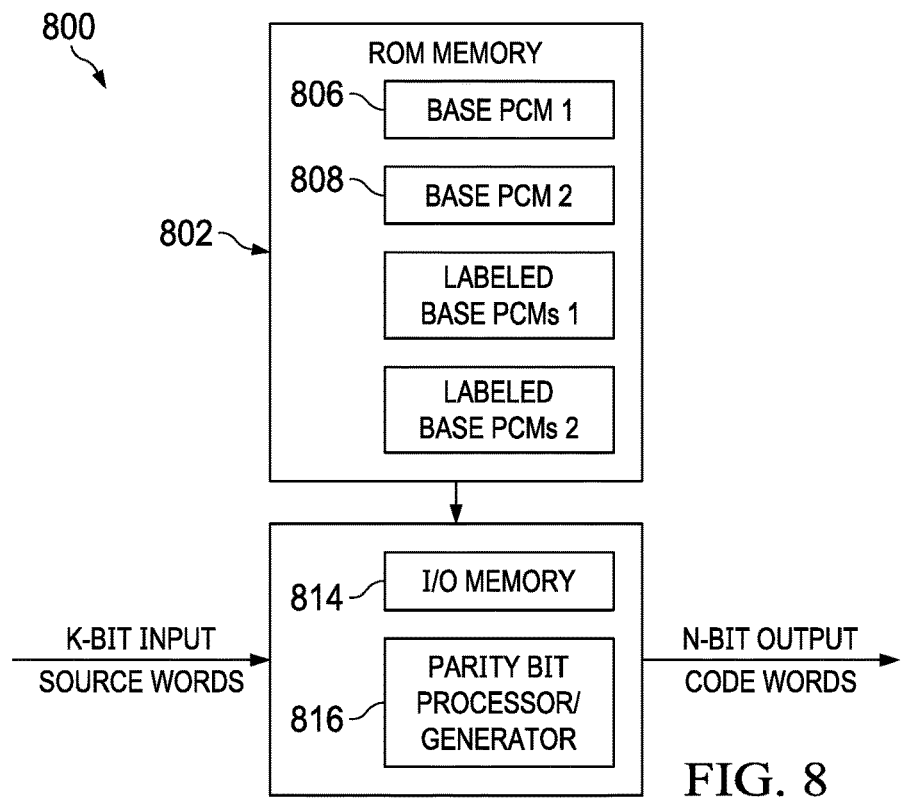
FIG. 8 is a block diagram of an embodiment of a LDPC encoder.

FIG. 8 is a block diagram of an embodiment of a LPDC encoder 800. The LPDC encoder 800 includes a read-only memory 802 where the first and second base graphs/PCMs 806, 808 are stored, I/O memory 814, and a parity bit processor/generator 816. The read-only memory 802 may also include the labeled PCMs of the first and second base graphs/PCMs. The encoder 800 receives a K-bit input source word and generates an N-bit output code word. The I/O memory 814 stores the input K-bit information word and the output N-bit code word. The I/O memory 814 is used by the parity bit processor/generator processor 816 for the input and output data. The parity bit processor/generator 816 generates an N-bit output code word according to the K-bit input using appropriate LDPC encoding methods, using the lifted PCMs.

The LDPC encoder 800 may efficiently encode a source word by directly on working on a parity-check matrix (PCM) due to its particular IRA (Irregular-Repeat-Accumulate) structure (sometimes also called dual-diagonal structure). FIG. 16 is an example of a QC matrix with an IRA structure. It is the exponent matrix of the IEEE802.16-2009 LDPC code with code word length n=2304, R=½ and the circulant size 96. The described embodiment parity-check matrices may also have IRA structure.

An efficient encoding method is described in Chapter 3 of "David Declercq, Marc Fossorier, and Ezio Biglieri; Channel Coding: Theory, Algorithms, and Applications Academic Press Library in Mobile and Wireless Communications (1st ed.); Academic Press (2014)" for IRA QC LDPC codes. Chapter 3 is incorporated herein by reference in its entirety.

Suppose that the matrix is specified by its c×t exponent matrix with circulant size Z such as shown above. Note that in such a matrix the column of index t−c=K/Z of all exponent matrices, i.e., the column associated with coded bits $x_{(t-c)Z}=p_0 \ldots, x_{(t-c+1)Z-1}=p_{Z-1}$, has exactly three non-negative elements, two of which are identical and one being unpaired. Next, the row index of this unpaired element is denoted by ξ. Encoding may then be efficiently performed as follows:

Let the vector containing the information symbols be $u=[u_0, u_1, \ldots, u_{t-c-1}]$, where for $0 \leq j \leq t-c-1$ vector $u_j$ contains the Z information bits associated with the jth column of the exponent matrix, i.e., $u_j=[u_{jZ}, \ldots, u_{(j+1)Z-1}]$. Similarly, let the vector containing the parity bits be $p=[p_0, \ldots, p_{c-1}]$, where for $0 \leq i \leq c-1$ vector $p_i$ contains the Z parity bits associated with the (t−c+i)th column of the exponent matrix, i.e., $p_i=[p_{iZ}, \ldots, p_{(i+1)Z-1}]$.

The Z parity bits forming $P_0$ are computed based on the Z parity-check equations corresponding to the row of the exponent matrix including the unpaired non-negative element of its (t−c)th column. In fact, letting $P_{i,j}$ be the square Z×Z matrix representing the expansion of element (i,j) in the exponent matrix, summing over all the parity-check equations yields $$P_{\xi,t-c}p_0 = \sum_{i=0}^{c-1} \sum_{j=0}^{t-c-1} P_{i,j}u_j$$

and therefore $$p_0 = (P_{\xi,t-c})^{-1} \sum_{i=0}^{c-1} \sum_{j=0}^{t-c-1} P_{i,j}u_j.$$

Note that multiplication by each $P_{i,j}$ as well as by $(P_{\xi,t-c})^{-1}$ simply represents a cyclic shift (the inverse of a circulant permutation matrix is itself a circulant permutation matrix). Once the elements of vector $p_0$ are known, for i=0, . . . , c−2, the elements of vector $p_{i+i}$ may be calculated as $$p_{i+1} = P_{i+1,t-c}p_0 + p_i + \sum_{j=0}^{t-c-1} P_{i+1,j}u_j,$$

where again all multiplications may be efficiently implemented as cyclic shifts, and where in the summation the term $p_i$ is not present if i=0.

Figure 9:
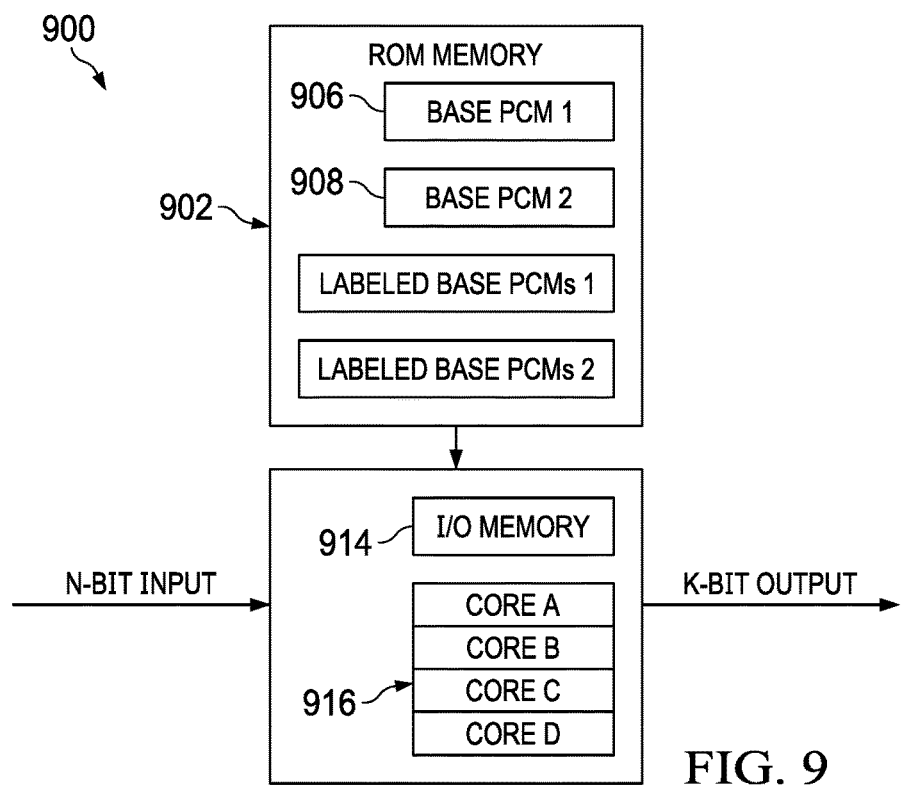
FIG. 9 is a block diagram of an embodiment of an LDPC decoder.

FIG. 9 is a block diagram of an embodiment of a LPDC decoder 900. In various embodiments, the decoder 900 may be a message passing decoder such as a belief-propagation (BP) decoder, min-sum decoder or their modifications such as normalized min-sum algorithm decoder (NMSA), offset min-sum algorithm decoder (OMSA), etc. In various further embodiments the decoder 900 is a multi-core block parallel decoder.

Unlike single block decoder which processes non-empty cells of each PCM row one by one in a sequential manner, multi-core block parallel decoder has several CNU cores processing entries from the same row in parallel. For such multi-core decoder it may happen that at the moment when the corresponding entry needs to be processed by a certain CNU core according to the predefined decoding schedule, input data from the previous row is not yet ready (i.e. it is still processed by this or another CNU due to the processing pipeline length), so certain number of clock cycles (stalls) need to be waited until the data is ready.

The LPDC decoder 900 includes a read-only memory (ROM) 902 for storing the first and second base graphs/PCMs 906, 908, I/O memory 904, and a check node processor 906. The decoder 900 receives an input LLR (log likelihood ratio) sequence of length N and generates a K-bit output. The I/O memory 914 stores the input vector of length N of the LLR values and the K-bit output information. The I/O memory is used by the check node processor 916 to generate the K-bit output. The check node processor 916 generates a K-bit output information bit sequence according to the received N-component input, using the lifted PCMs.

Figure 10:
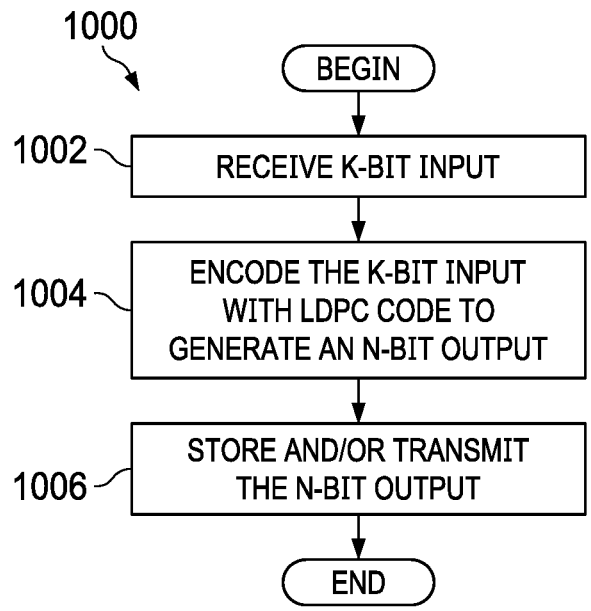
FIG. 10 is a flowchart of an embodiment of a method for encoding data using LDPC.

FIG. 10 is a flowchart of an embodiment of a method 1000 for encoding data using LDPC with the disclosed lifted PCMs. The method 1000 includes, at a first step, at step 1002, receiving a K-bit source word. In the next step, at step 1004, the K-bit source word is encoded by an LPDC encoder to produce an N-bit code word using the disclosed PCMs. In the next step, at step 1006, the encoder then transmits the N-bit code word.

Figure 11:
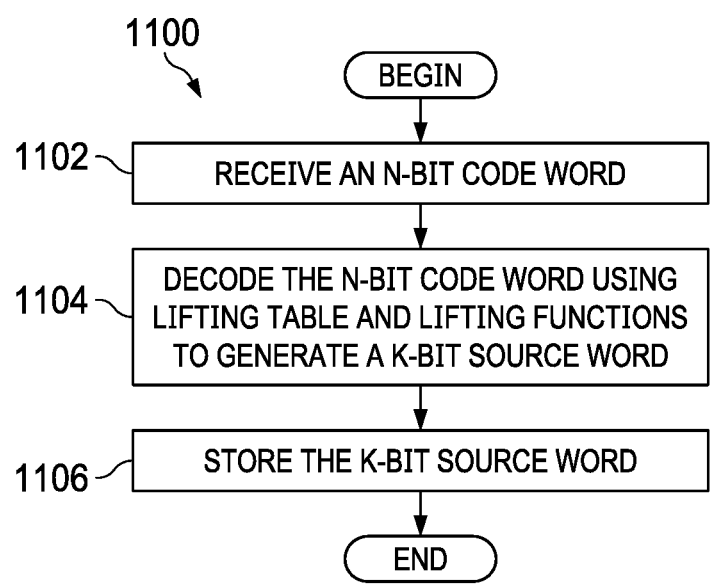
FIG. 11 is a flowchart of an embodiment of a method for decoding data using LDPC.

FIG. 11 is a flowchart of an embodiment of a method 1100 for decoding data using LDPC, the disclosed lifted PCMs. The method 1100 includes, in a first step, at 1102, receiving an N-bit code word. In the next step, at step 1104, the N-bit code word is decoded by an LPDC decoder to produce a K-bit source word using the disclosed lifted PCMs. In the next step, at step 1106, the decoder then stores the K-bit source word. The decoder uses the redundancy in the received information sequence in a decoding operation performed by the decoder to correct errors in the received information sequence and produce a decoded information sequence. The decoded information sequence is an estimate of the encoded information sequence from which (an estimate of) the information sequence can be extracted.

Figure 12:
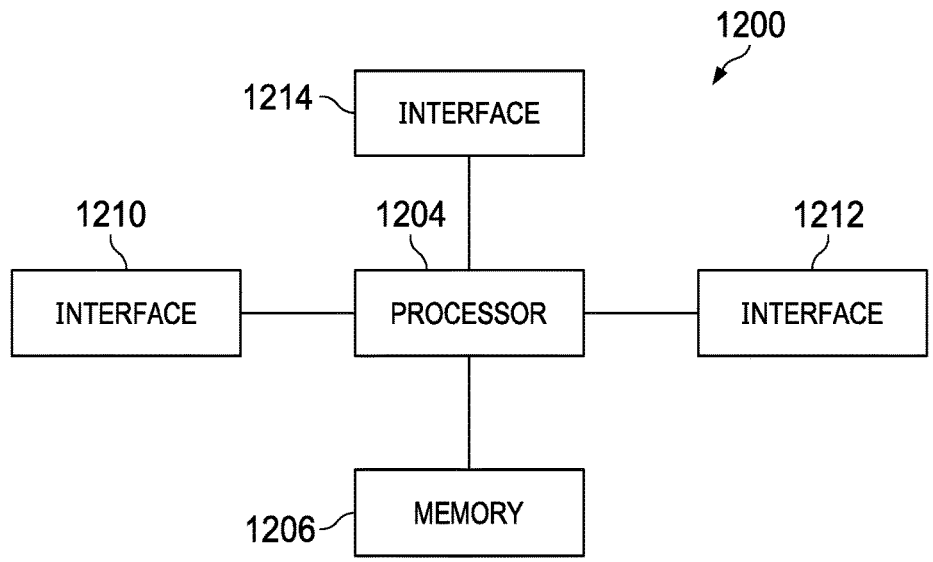
FIG. 12 illustrates a block diagram of an embodiment processing system for performing methods described herein, which may be installed in a host device.

FIG. 12 illustrates a block diagram of an embodiment processing system 1200 for performing methods described herein, which may be installed in a host device. As shown, the processing system 1200 includes a processor 1204, a memory 1206, and interfaces 1210-1214, which may (or may not) be arranged as shown in FIG. 12. The processor 1204 may be any component or collection of components adapted to perform computations and/or other processing related tasks, and the memory 1206 may be any component or collection of components adapted to store programming and/or instructions for execution by the processor 1204. In an embodiment, the memory 1206 includes a non-transitory computer readable medium. The interfaces 1210, 1212, 1214 may be any component or collection of components that allow the processing system 1200 to communicate with other devices/components and/or a user. For example, one or more of the interfaces 1210, 1212, 1214 may be adapted to communicate data, control, or management messages from the processor 1204 to applications installed on the host device and/or a remote device. As another example, one or more of the interfaces 1210, 1212, 1214 may be adapted to allow a user or user device (e.g., personal computer (PC), etc.) to interact/communicate with the processing system 1200. The processing system 1200 may include additional components not depicted in FIG. 12, such as a decoder or an encoder.

In some embodiments, the processing system 1200 is included in a network device that is accessing, or part otherwise of, a telecommunications network. In one example, the processing system 1200 is in a network-side device in a wireless or wireline telecommunications network, such as a base station, a relay station, a scheduler, a controller, a gateway, a router, an applications server, or any other device in the telecommunications network. In other embodiments, the processing system 1200 is in a user-side device accessing a wireless or wireline telecommunications network, such as a mobile station, a user equipment (UE), a personal computer (PC), a tablet, a wearable communications device (e.g., a smartwatch, etc.), or any other device adapted to access a telecommunications network.

In some embodiments, one or more of the interfaces 1210, 1212, 1214 connects the processing system 1200 to a transceiver adapted to transmit and receive signaling over the telecommunications network.

Figure 13:
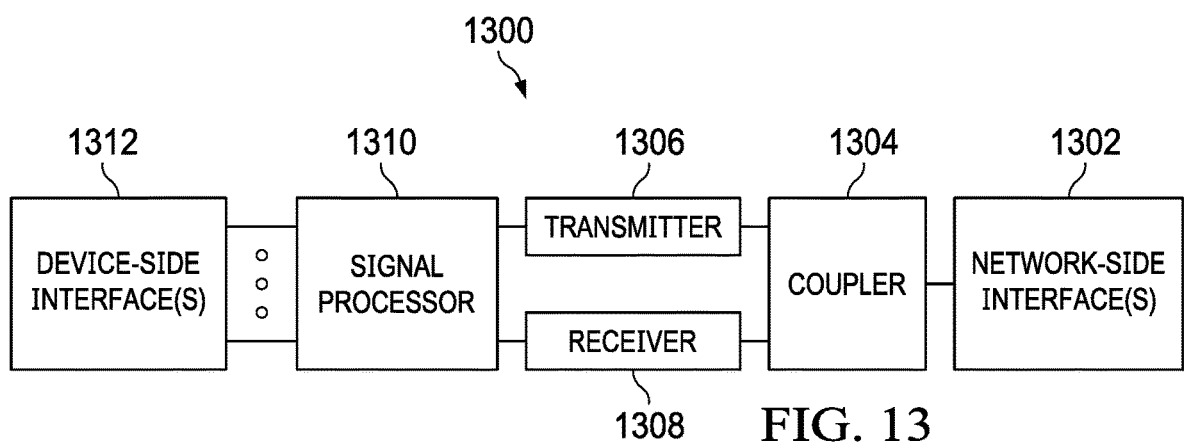
FIG. 13 illustrates a block diagram of a transceiver adapted to transmit and receive signaling over a telecommunications network.

FIG. 13 illustrates a block diagram of a transceiver 1300 adapted to transmit and receive signaling over a telecommunications network. The transceiver 1300 may be installed in a host device. As shown, the transceiver 1300 includes a network-side interface 1302, a coupler 1304, a transmitter 1306, a receiver 1308, a signal processor 1310, and a device-side interface 1312. The network-side interface 1302 may include any component or collection of components adapted to transmit or receive signaling over a wireless or wireline telecommunications network. The coupler 1304 may include any component or collection of components adapted to facilitate bi-directional communication over the network-side interface 1302. The transmitter 1306 may include any component or collection of components (e.g., up-converter, power amplifier, encoder, etc.) adapted to convert a baseband signal into a modulated carrier signal suitable for transmission over the network-side interface 1302. The receiver 1308 may include any component or collection of components (e.g., down-converter, low noise amplifier, decoder, etc.) adapted to convert a carrier signal received over the network-side interface 1302 into a baseband signal. The signal processor 1310 may include any component or collection of components adapted to convert a baseband signal into a data signal suitable for communication over the device-side interface(s) 1312, or vice-versa (may include a decoder or encoder). The device-side interface(s) 1312 may include any component or collection of components adapted to communicate data-signals between the signal processor 1310 and components within the host device (e.g., the processing system 1300, local area network (LAN) ports, etc.).

The transceiver 1300 may transmit and receive signaling over any type of communications medium. In some embodiments, the transceiver 1300 transmits and receives signaling over a wireless medium. For example, the transceiver 1300 may be a wireless transceiver adapted to communicate in accordance with a wireless telecommunications protocol, such as a cellular protocol (e.g., long-term evolution (LTE), etc.), a wireless local area network (WLAN) protocol (e.g., Wi-Fi, etc.), or any other type of wireless protocol (e.g., Bluetooth, near field communication (NFC), etc.). In such embodiments, the network-side interface 1302 includes one or more antenna/radiating elements. For example, the network-side interface 1302 may include a single antenna, multiple separate antennas, or a multi-antenna array configured for multi-layer communication, e.g., single input multiple output (SIMO), multiple input single output (MISO), multiple input multiple output (MIMO), etc. In other embodiments, the transceiver 1300 transmits and receives signaling over a wireline medium, e.g., twisted-pair cable, coaxial cable, optical fiber, etc. Specific processing systems and/or transceivers may utilize all of the components shown, or only a subset of the components, and levels of integration may vary from device to device.

Figure 14:
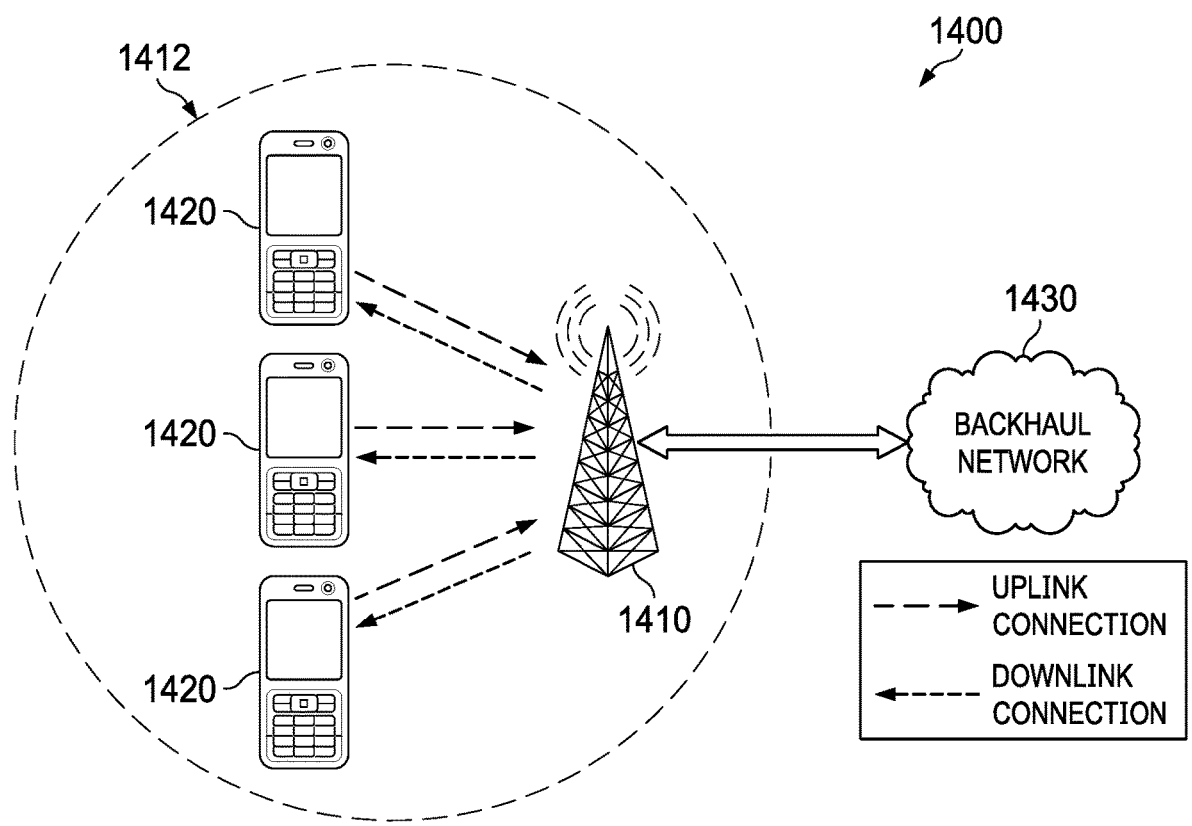
FIG. 14 illustrates an embodiment network for communicating data in which the disclosed methods and systems may be implemented.

FIG. 14 illustrates an embodiment network 1400 for communicating data in which the disclosed methods and systems may be implemented. The network 1400 includes a plurality of network components. The network components may include an access point (AP), a station (STA) (e.g., a wireless device or user equipment (UE) such as a wireless phone, etc.), or any other wireless reception point. In an embodiment, the network 1400 includes an access point (AP) 1410 having a coverage area 1412, a plurality of STAs 1420, and a backhaul network 1430. In an embodiment, the AP may be implemented as transceiver 1300 shown in FIG. 13. In an embodiment, the STAs 1420 may be implemented as, for example, processing system 1200 shown in FIG. 12. As used herein, the term AP may also be referred to as a transmission point (TP) and the two terms may be used interchangeably throughout this disclosure. In various embodiments, the AP 1410 may be a base station (BS) also referred to as a base transceiver station (BTS). Examples of a BS include an e Node B (eNB), a gNB, and the like. In an embodiment, the AP 1410 may be a wireless router. Thus, the AP 1410 may include any component capable of providing wireless access by, inter alia, establishing uplink (dashed line) and/or downlink (dotted line) connections with the STAs 1420. The STAs 1420 may include any component capable of establishing a wireless connection with the AP 1410. Examples of STAs 1420 include mobile phones, tablet computers, and laptop computers. The backhaul network 1430 may be any component or collection of components that allow data to be exchanged between the AP 1410 and a remote end (not shown). In some embodiments, the network 1400 may include various other wireless devices, such as relays, femtocells, etc.

It should be appreciated that one or more steps of the embodiment methods provided herein may be performed by corresponding units or modules. For example, a signal may be transmitted by a transmitting unit or a transmitting module. A signal may be received by a receiving unit or a receiving module. A signal may be processed by a processing unit or a processing module. Other steps may be performed by an iterating unit/module, a difference unit/module, an adjustment unit/module, a generating unit/module, a calculating unit/module, an assigning unit/module, an incrementing unit/module, a decrementing unit/module, and/or a setting unit/module. The respective units/modules may be hardware, software, or a combination thereof. For instance, one or more of the units/modules may be an integrated circuit, such as field programmable gate arrays (FPGAs) or application-specific integrated circuits (ASICs).

The following embodiments and aspects of the disclosure can be combined in all possible combinations and permutations.

In a first embodiment a decoding method includes receiving, at a receiver of a receiving side, signals from a transmitting side, the signals including a code word and decoding, at a decoder of the receiving side, the code word using a low density parity check (LDPC) code in which each n adjacent rows, n>1, in an extension part of a base parity check matrix (PCM) are orthogonal except for punctured information columns.

According to a first aspect of this embodiment each m rows, m>1, in the punctured information columns in the extension part of the base PCM have not more than 1 conflict.

According to a second aspect of this embodiment m=2.

According to a third aspect of this embodiment shifts of each 2 conflict cells in the punctured information columns of a labeled PCM in the extension part are equal.

According to a fourth aspect of this embodiment each 2 adjacent rows in a core matrix of the base PCM are orthogonal except for the punctured information columns and dual diagonal parity check columns.

According to a fifth aspect of this embodiment the 2 last adjacent rows in a core matrix of the base PCM, except for punctured information columns, have shifts equal to zero.

According to a sixth aspect of this embodiment n=4.

According to a seventh aspect of this embodiment the LDPC code is a nested LDPC code, wherein the nested LDPC code includes a first base graph as disclosed in FIG. 3A.

According to a eighth aspect of this embodiment the LDPC code is a nested LDPC code, wherein the nested LDPC code includes a second base graph as disclosed in FIG. 4A.

According to a ninth aspect of this embodiment a core matrix of the base PCM is a 6×16 matrix with the following structure:

$$\begin{pmatrix} 1 & 1 & 0 & 0 & 1 & 0 & 1 & 1 & 0 & 0 & 1 & 1 & 0 & 0 & 0 & 0 \\ 1 & 0 & 1 & 1 & 0 & 1 & 1 & 0 & 0 & 1 & 0 & 1 & 1 & 0 & 0 & 0 \\ 1 & 0 & 1 & 1 & 1 & 0 & 0 & 1 & 0 & 0 & 1 & 0 & 1 & 1 & 0 & 0 \\ 1 & 1 & 0 & 0 & 0 & 1 & 0 & 0 & 1 & 1 & 0 & 0 & 0 & 1 & 1 & 0 \\ 1 & 1 & 0 & 0 & 1 & 1 & 0 & 0 & 1 & 1 & 0 & 0 & 0 & 0 & 1 & 1 \\ 1 & 0 & 1 & 1 & 0 & 0 & 1 & 1 & 1 & 0 & 1 & 0 & 0 & 0 & 0 & 1 \end{pmatrix}.$$

In a second embodiment an encoding method includes encoding, at an encoder of a transmitting side, information bits into a code word and transmitting, at a transmitter of the transmitting side, signals to a receiving side, the signals including the code word, wherein the information bits are encoded using a LDPC code in which each n adjacent rows, n>1, in an extension part of a base parity check matrix (PCM) are orthogonal except for punctured information columns.

According to a first aspect of this embodiment each m rows, m>1, in the punctured information columns in the extension part of the base PCM has not more than 1 conflict.

According to a second aspect of this embodiment m=2.

According to a third aspect of this embodiment shifts of each 2 conflict cells in the punctured information columns of a labeled PCM in the extension part are equal.

According to a fourth aspect of this embodiment each 2 adjacent rows in a core matrix of the base PCM are orthogonal except for the punctured information columns and dual diagonal parity check columns.

According to a fifth aspect of this embodiment the 2 last adjacent rows in a core matrix of the base PCM, except for punctured information columns, have shifts equal to zero.

According to a sixth aspect of this embodiment n=4.

According to a seventh aspect of this embodiment the LDPC code is a nested LDPC code, wherein the nested LDPC code includes a first base graph as disclosed in FIG. 3A.

According to an eighth aspect of this embodiment the LDPC code is a nested LDPC code, wherein the nested LDPC code includes a second base graph as disclosed in FIG. 4A.

According to a ninth aspect of this embodiment a core matrix of the base PCM is a 6×16 matrix with the following structure:

$$\begin{pmatrix} 1 & 1 & 0 & 0 & 1 & 0 & 1 & 1 & 0 & 0 & 1 & 1 & 0 & 0 & 0 & 0 \\ 1 & 0 & 1 & 1 & 0 & 1 & 1 & 0 & 0 & 1 & 0 & 1 & 1 & 0 & 0 & 0 \\ 1 & 0 & 1 & 1 & 1 & 0 & 0 & 1 & 0 & 0 & 1 & 0 & 1 & 1 & 0 & 0 \\ 1 & 1 & 0 & 0 & 0 & 1 & 0 & 0 & 1 & 1 & 0 & 0 & 0 & 1 & 1 & 0 \\ 1 & 1 & 0 & 0 & 1 & 1 & 0 & 0 & 1 & 1 & 0 & 0 & 0 & 0 & 1 & 1 \\ 1 & 0 & 1 & 1 & 0 & 0 & 1 & 1 & 1 & 0 & 1 & 0 & 0 & 0 & 0 & 1 \end{pmatrix}.$$

In a third embodiment a decoder includes a processor and a computer readable storage medium storing programming for execution by the processor, the programming including instructions to decode a code word using a low density parity check (LDPC) code in which each n adjacent rows, n>1, in an extension part of a base parity check matrix (PCM) are orthogonal except for punctured information columns.

In a fourth embodiment an encoder includes a processor and a computer readable storage medium storing programming for execution by the processor, the programming including instructions to encode information bits into a code word, wherein the information bits are encoded using a low density parity check (LDPC) code in which each n adjacent rows, n>1, in an extension part of a base parity check matrix (PCM) are orthogonal except for punctured information columns.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A decoding method comprising:
receiving, by a receiving device, a code word from a transmitting device; and
decoding, by the receiving device, the code word using a low density parity check (LDPC) code in which each n adjacent rows in an extension part of a base parity check matrix (PCM), associated with the LDPC code, are orthogonal except for punctured information columns, n being an integer greater than one,
wherein each two adjacent rows core matrix of the base PCM are orthogonal except for the punctured information columns and dual diagonal parity check columns, and
wherein each m rows in the punctured information columns in the extension part of the base PCM have fewer than two conflicts, m being an integer greater than one.

2. The method of claim 1, wherein m=2.

3. The method of claim 1, wherein shifts of each two conflict cells in the punctured information columns of a labeled PCM in the extension part are equal.

4. The method of claim 1, wherein two last adjacent rows in a core matrix of the base PCM, except for punctured information columns, have shifts equal to zero.

5. The method of claim 1, wherein n=4.

6. The method of claim 1, wherein a core matrix of the base PCM is a 6×16 matrix with the following structure:

$$\begin{pmatrix} 1 & 1 & 0 & 0 & 1 & 0 & 1 & 1 & 0 & 0 & 1 & 1 & 0 & 0 & 0 & 0 \\ 1 & 0 & 1 & 1 & 0 & 1 & 1 & 0 & 0 & 1 & 0 & 1 & 1 & 0 & 0 & 0 \\ 1 & 0 & 1 & 1 & 1 & 0 & 0 & 1 & 0 & 0 & 1 & 0 & 1 & 1 & 0 & 0 \\ 1 & 1 & 0 & 0 & 0 & 1 & 0 & 0 & 1 & 1 & 0 & 0 & 0 & 1 & 1 & 0 \\ 1 & 1 & 0 & 0 & 1 & 1 & 0 & 0 & 1 & 1 & 0 & 0 & 0 & 0 & 1 & 1 \\ 1 & 0 & 1 & 1 & 0 & 0 & 1 & 1 & 1 & 0 & 1 & 0 & 0 & 0 & 0 & 1 \end{pmatrix}.$$

7. The method of claim 1, wherein the LDPC code is a nested LDPC code, wherein the nested LDPC code includes a first base graph, wherein the first base graph includes a 42×52 matrix, wherein columns 1-16 of the first base graph are represented by

| | | | | | | | | | | | | | | | |
|---|---|---|---|---|---|---|---|---|---|---|---|---|---|---|---|
| 1 | 0 | 1 | 1 | 1 | 0 | 1 | 1 | 1 | 0 | 1 | 1 | 0 | 0 | 0 | 0 |
| 1 | 1 | 0 | 0 | 0 | 1 | 0 | 0 | 0 | 1 | 0 | 1 | 1 | 0 | 0 | 0 |
| 1 | 0 | 1 | 1 | 0 | 0 | 1 | 0 | 0 | 1 | 1 | 0 | 0 | 0 | 0 | 0 |
| 1 | 1 | 0 | 0 | 1 | 1 | 0 | 0 | 1 | 1 | 0 | 0 | 1 | 1 | 1 | 0 |
| 1 | 1 | 1 | 0 | 0 | 0 | 1 | 0 | 0 | 0 | 0 | 0 | 0 | 0 | 1 | 1 |
| 1 | 0 | 0 | 1 | 1 | 1 | 0 | 1 | 1 | 1 | 1 | 0 | 0 | 0 | 0 | 1 |
| 1 | 1 | 0 | 0 | 0 | 0 | 0 | 0 | 0 | 0 | 0 | 0 | 0 | 0 | 0 | 0 |
| 1 | 0 | 0 | 0 | 1 | 1 | 0 | 0 | 0 | 0 | 0 | 1 | 0 | 0 | 0 | 0 |
| 1 | 1 | 1 | 0 | 0 | 0 | 0 | 0 | 1 | 0 | 0 | 0 | 0 | 0 | 0 | 0 |
| 1 | 0 | 0 | 1 | 0 | 0 | 0 | 1 | 0 | 1 | 0 | 0 | 0 | 0 | 0 | 0 |
| 1 | 1 | 0 | 0 | 0 | 0 | 0 | 1 | 0 | 0 | 0 | 0 | 0 | 1 | 0 | 0 |
| 1 | 0 | 0 | 0 | 1 | 0 | 0 | 0 | 0 | 0 | 0 | 0 | 0 | 0 | 0 | 1 |
| 0 | 1 | 1 | 0 | 1 | 0 | 0 | 0 | 0 | 0 | 0 | 0 | 0 | 0 | 0 | 0 |
| 1 | 1 | 0 | 1 | 0 | 0 | 0 | 1 | 0 | 0 | 0 | 0 | 0 | 0 | 0 | 0 |
| 1 | 0 | 0 | 0 | 0 | 0 | 1 | 0 | 0 | 1 | 0 | 0 | 0 | 0 | 0 | 0 |
| 0 | 1 | 1 | 0 | 0 | 0 | 1 | 0 | 0 | 0 | 0 | 0 | 0 | 1 | 0 | 0 |
| 1 | 1 | 0 | 0 | 0 | 0 | 0 | 0 | 0 | 0 | 0 | 0 | 0 | 0 | 0 | 1 |
| 0 | 1 | 0 | 0 | 0 | 0 | 0 | 1 | 0 | 1 | 0 | 0 | 0 | 0 | 0 | 0 |
| 1 | 0 | 1 | 1 | 0 | 0 | 0 | 0 | 0 | 0 | 0 | 0 | 0 | 0 | 0 | 1 |
| 1 | 0 | 0 | 0 | 0 | 1 | 0 | 0 | 0 | 0 | 1 | 0 | 0 | 0 | 0 | 0 |
| 1 | 0 | 0 | 0 | 0 | 1 | 0 | 0 | 0 | 0 | 0 | 0 | 0 | 0 | 0 | 1 |
| 0 | 1 | 0 | 1 | 0 | 0 | 0 | 1 | 0 | 0 | 0 | 0 | 0 | 0 | 0 | 0 |
| 1 | 0 | 1 | 0 | 0 | 0 | 0 | 0 | 0 | 0 | 0 | 0 | 1 | 0 | 0 | 0 |
| 0 | 1 | 0 | 0 | 0 | 0 | 1 | 0 | 1 | 0 | 0 | 0 | 0 | 0 | 0 | 0 |
| 0 | 1 | 0 | 0 | 1 | 0 | 0 | 0 | 0 | 0 | 0 | 0 | 0 | 0 | 0 | 1 |
| 1 | 0 | 0 | 1 | 1 | 0 | 0 | 0 | 0 | 0 | 0 | 0 | 0 | 0 | 0 | 0 |
| 1 | 0 | 1 | 0 | 0 | 0 | 0 | 0 | 0 | 0 | 1 | 0 | 0 | 0 | 0 | 0 |
| 1 | 0 | 0 | 0 | 0 | 0 | 0 | 0 | 0 | 0 | 0 | 0 | 1 | 0 | 0 | 0 |
| 1 | 0 | 0 | 0 | 1 | 0 | 0 | 0 | 1 | 0 | 0 | 0 | 0 | 0 | 0 | 0 |
| 1 | 0 | 0 | 0 | 0 | 0 | 0 | 0 | 0 | 0 | 1 | 0 | 0 | 0 | 0 | 0 |
| 0 | 1 | 0 | 0 | 0 | 0 | 0 | 0 | 0 | 0 | 0 | 0 | 1 | 0 | 0 | 0 |
| 1 | 0 | 1 | 0 | 0 | 0 | 1 | 0 | 0 | 0 | 0 | 0 | 0 | 0 | 0 | 0 |
| 0 | 1 | 0 | 0 | 0 | 0 | 0 | 0 | 0 | 0 | 0 | 1 | 0 | 0 | 0 | 0 |
| 1 | 0 | 0 | 1 | 0 | 1 | 0 | 0 | 0 | 0 | 0 | 0 | 0 | 0 | 0 | 0 |
| 0 | 0 | 0 | 0 | 0 | 0 | 1 | 0 | 0 | 0 | 0 | 0 | 0 | 1 | 1 | |
| 0 | 1 | 0 | 0 | 1 | 0 | 0 | 0 | 0 | 0 | 0 | 0 | 0 | 0 | 0 | 0 |
| 1 | 0 | 1 | 0 | 0 | 1 | 0 | 0 | 0 | 0 | 0 | 0 | 0 | 0 | 0 | 0 |
| 1 | 0 | 0 | 1 | 0 | 0 | 0 | 0 | 0 | 1 | 0 | 0 | 0 | 0 | 0 | 0 |
| 1 | 0 | 0 | 0 | 0 | 0 | 0 | 0 | 0 | 0 | 0 | 0 | 0 | 1 | 1 | |
| 1 | 0 | 0 | 0 | 0 | 0 | 0 | 0 | 1 | 1 | 0 | 0 | 0 | 0 | 0 | 0 |
| 1 | 0 | 0 | 0 | 0 | 0 | 0 | 0 | 0 | 0 | 1 | 0 | 0 | 0 | 0 | 0 | wherein columns 17-34 of the first base graph are represented by

| | | | | | | | | | | | | | | | | | |
|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 | 0 | 0 |
| 0 | 0 | 0 | 0 | 1 | 0 | 0 | 0 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 | 0 | 0 |
| 0 | 0 | 0 | 0 | 0 | 0 | 1 | 0 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 | 0 | 0 |
| 0 | 0 | 0 | 0 | 0 | 0 | 0 | 1 | 0 | 0 | 0 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 | 0 | 0 |
| 0 | 0 | 0 | 0 | 0 | 0 | 0 | 0 | 0 | 1 | 0 | 0 | 0 | 0 | 0 | 0 | 0 | 0 |
| 0 | 0 | 0 | 0 | 0 | 0 | 0 | 0 | 0 | 0 | 1 | 0 | 0 | 0 | 0 | 0 | 0 | 0 |
| 0 | 0 | 0 | 0 | 0 | 0 | 0 | 0 | 0 | 0 | 0 | 1 | 0 | 0 | 0 | 0 | 0 | 0 |
| 0 | 0 | 0 | 0 | 0 | 0 | 0 | 0 | 0 | 0 | 0 | 0 | 1 | 0 | 0 | 0 | 0 | 0 |
| 0 | 0 | 0 | 0 | 0 | 0 | 0 | 0 | 0 | 0 | 0 | 0 | 0 | 1 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 | and wherein columns 35-52 of the first base graph are represented by

```
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
0 0 0 0 0 0 0 0 0 0 0 0 0 0 0 0 0 0
1 0 0 0 0 0 0 0 0 0 0 0 0 0 0 0 0 0
0 1 0 0 0 0 0 0 0 0 0 0 0 0 0 0 0 0
0 0 1 0 0 0 0 0 0 0 0 0 0 0 0 0 0 0
0 0 0 1 0 0 0 0 0 0 0 0 0 0 0 0 0 0
0 0 0 0 1 0 0 0 0 0 0 0 0 0 0 0 0 0
0 0 0 0 0 1 0 0 0 0 0 0 0 0 0 0 0 0
0 0 0 0 0 0 1 0 0 0 0 0 0 0 0 0 0 0
0 0 0 0 0 0 0 1 0 0 0 0 0 0 0 0 0 0
0 0 0 0 0 0 0 0 0 0 0 1 0 0 0 0 0 0
0 0 0 0 0 0 0 0 0 0 0 0 1 0 0 0 0 0
0 0 0 0 0 0 0 0 0 0 0 0 0 1 0 0 0 0
0 0 0 0 0 0 0 0 0 0 0 0 0 0 1 0 0 0
0 0 0 0 0 0 0 0 0 0 0 0 0 0 0 1 0 0
0 0 0 0 0 0 0 0 0 0 0 0 0 0 0 0 1 0
0 0 0 0 0 0 0 0 0 0 0 0 0 0 0 0 0 1.
```

8. An encoding method comprising:

encoding, at an encoder of a transmitting device, information bits into a code word; and transmitting, at a transmitter of the transmitting device, signals to a receiving device, the signals including the code word, wherein the information bits are encoded using a LDPC code in which each n adjacent rows in an extension part of a base parity check matrix (PCM), associated with the LDPC code, are orthogonal except for punctured information columns, n being an integer greater than one, wherein each 2 adjacent rows in a core matrix of the base PCM are orthogonal except for the punctured information columns and dual diagonal parity check columns, and wherein each m rows in the punctured information columns in the extension part of the base PCM have fewer than two conflicts, m being an integer greater than one.

9. The method of claim 8, wherein m=2.

10. The method of claim 8, wherein shifts of each two conflict cells in the punctured information columns of a labeled PCM in the extension part are equal.

11. The method of claim 8, wherein two last adjacent rows in a core matrix of the base PCM, except for punctured information columns, have shifts equal to zero.

12. The method of claim 8, wherein n=4.

13. The method of claim 9, wherein a core matrix of the base PCM is a 6×16 matrix with the following structure:

$$\begin{pmatrix} 1 & 1 & 0 & 0 & 1 & 0 & 1 & 1 & 0 & 0 & 1 & 1 & 0 & 0 & 0 & 0 \\ 1 & 0 & 1 & 1 & 0 & 1 & 1 & 0 & 0 & 1 & 0 & 1 & 1 & 0 & 0 & 0 \\ 1 & 0 & 1 & 1 & 1 & 0 & 0 & 1 & 0 & 0 & 1 & 0 & 1 & 1 & 0 & 0 \\ 1 & 1 & 0 & 0 & 0 & 1 & 0 & 0 & 1 & 1 & 0 & 0 & 0 & 1 & 1 & 0 \\ 1 & 1 & 0 & 0 & 1 & 1 & 0 & 0 & 1 & 1 & 0 & 0 & 0 & 0 & 1 & 1 \\ 1 & 0 & 1 & 1 & 0 & 0 & 1 & 1 & 1 & 0 & 1 & 0 & 0 & 0 & 0 & 1 \end{pmatrix}.$$

14. The method of claim 8, wherein the LDPC code is a nested LDPC code, and wherein the nested LDPC code includes a first base graph, wherein the first base graph includes a 42×52 matrix, wherein columns 1-16 of the first base graph are represented by

```
1 0 1 1 1 0 1 1 1 0 1 1 0 0 0 0
1 1 0 0 0 1 0 0 0 1 0 1 1 0 0 0
1 0 1 1 0 0 1 1 0 0 1 0 1 1 0 0
1 1 0 0 1 1 0 0 1 1 0 0 0 1 1 0
1 1 1 0 0 0 1 0 0 0 0 0 0 0 1 1
1 0 0 1 1 1 0 1 1 1 1 0 0 0 0 1
1 1 0 0 0 0 0 0 0 0 0 0 0 0 0 0
1 0 0 0 1 1 0 0 0 0 1 0 0 0 0 0
1 1 1 0 0 0 0 0 1 0 0 0 0 0 0 0
1 0 0 1 0 0 0 1 0 1 0 0 0 0 0 0
1 1 0 0 0 0 1 0 0 0 0 0 0 1 0 0
1 0 0 0 1 0 0 0 0 0 0 0 0 0 0 1
0 1 1 0 1 0 0 0 0 0 0 0 0 0 0 0
1 1 0 1 0 0 0 1 0 0 0 0 0 0 0 0
1 0 0 0 0 0 1 0 0 1 0 0 0 0 0 0
0 1 0 0 0 1 0 0 0 0 0 0 0 1 0
1 1 0 0 0 0 0 0 0 0 0 0 0 0 0 1
0 1 0 0 0 0 0 1 0 0 1 0 0 0 0 0
1 0 1 1 0 0 0 0 0 0 0 0 0 0 0 0
1 0 0 0 0 0 0 0 0 0 1 0 0 0 1 0
```

| | | | | | | | | | | | | | | | |
|---|---|---|---|---|---|---|---|---|---|---|---|---|---|---|---|
|1|0|0|0|0|0|1|0|0|0|0|0|0|0|0|1|
|1|0|0|0|0|1|0|0|0|0|0|1|0|0|0|0|
|0|1|0|1|0|0|0|1|0|0|0|0|0|0|0|0|
|1|0|1|0|0|0|0|0|0|0|0|0|0|0|1|0|
|0|1|0|0|0|0|0|1|0|1|0|0|0|0|0|0|
|0|1|0|0|0|1|0|0|0|0|0|0|0|0|0|1|
|1|0|0|1|1|0|0|0|0|0|0|0|0|0|0|0|
|1|0|1|0|0|0|0|0|0|0|0|0|0|1|0|0|
|1|0|0|0|0|0|1|0|0|0|1|0|0|0|0|0|
|1|0|0|0|1|0|0|0|0|1|0|0|0|0|0|0|
|1|0|0|0|0|0|0|0|0|0|1|0|0|0|0|0|
|0|1|0|0|0|0|0|0|0|0|0|0|0|1|0|0|
|1|0|1|0|0|0|0|1|0|0|0|0|0|0|0|0|
|0|1|0|0|0|0|0|0|0|0|0|1|0|0|0|0|
|1|0|0|1|0|1|0|0|0|0|0|0|0|0|0|0|
|0|0|0|0|0|0|1|0|0|0|0|0|0|1|1|0|
|0|1|0|0|1|0|0|0|0|0|0|0|0|0|0|0|
|1|0|1|0|0|1|0|0|0|0|0|0|0|0|0|0|
|1|0|0|1|0|0|0|0|0|0|1|0|0|0|0|0|
|1|0|0|0|0|0|0|0|0|0|0|0|0|0|1|1|
|1|0|0|0|0|0|0|0|1|1|0|0|0|0|0|0|
|1|0|0|0|0|0|0|0|0|0|0|1|0|0|0|0| wherein columns 17-34 of the first base graph are represented by

| | | | | | | | | | | | | | |
|---|---|---|---|---|---|---|---|---|---|---|---|---|---|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|1|0|0|0|0|0|0|0|0|0|0|0|0 0 0 0 0|
|0|1|0|0|0|0|0|0|0|0|0|0|0 0 0 0 0|
|0|0|1|0|0|0|0|0|0|0|0|0|0 0 0 0 0|

| | | | | | | | | | | | | |
|---|---|---|---|---|---|---|---|---|---|---|---|---|
|0|0|0|1|0|0|0|0|0|0|0|0|0 0 0 0 0|
|0|0|0|0|1|0|0|0|0|0|0|0|0 0 0 0 0|
|0|0|0|0|0|1|0|0|0|0|0|0|0 0 0 0 0|
|0|0|0|0|0|0|1|0|0|0|0|0|0 0 0 0 0|
|0|0|0|0|0|0|0|1|0|0|0|0|0 0 0 0 0|
|0|0|0|0|0|0|0|0|1|0|0|0|0 0 0 0 0|
|0|0|0|0|0|0|0|0|0|1|0|0|0 0 0 0 0|
|0|0|0|0|0|0|0|0|0|0|1|0|0 0 0 0 0|
|0|0|0|0|0|0|0|0|0|0|0|1|0 0 0 0 0|
|0|0|0|0|0|0|0|0|0|0|0|0|1 0 0 0 0|
|0|0|0|0|0|0|0|0|0|0|0|0|0 1 0 0 0|
|0|0|0|0|0|0|0|0|0|0|0|0|0 0 1 0 0|
|0|0|0|0|0|0|0|0|0|0|0|0|0 0 0 1 0|
|0|0|0|0|0|0|0|0|0|0|0|0|0 0 0 0 1|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0|
|0|0|0|0|0|0|0|0|0|0|0|0|0 0 0 0 0| and wherein columns 35-52 of the first base graph are represented by

| | | | | | | | | | | | | | | | | | |
|---|---|---|---|---|---|---|---|---|---|---|---|---|---|---|---|---|---|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|0|0|0|0|0|0|0|0|0|0|0|0|0|0|0|0|0|0|
|1|0|0|0|0|0|0|0|0|0|0|0|0|0|0|0|0|0|
|0|1|0|0|0|0|0|0|0|0|0|0|0|0|0|0|0|0|
|0|0|1|0|0|0|0|0|0|0|0|0|0|0|0|0|0|0|
|0|0|0|1|0|0|0|0|0|0|0|0|0|0|0|0|0|0|
|0|0|0|0|1|0|0|0|0|0|0|0|0|0|0|0|0|0|
|0|0|0|0|0|1|0|0|0|0|0|0|0|0|0|0|0|0|
|0|0|0|0|0|0|1|0|0|0|0|0|0|0|0|0|0|0|
|0|0|0|0|0|0|0|1|0|0|0|0|0|0|0|0|0|0|
|0|0|0|0|0|0|0|0|1|0|0|0|0|0|0|0|0|0|
|0|0|0|0|0|0|0|0|0|1|0|0|0|0|0|0|0|0|
|0|0|0|0|0|0|0|0|0|0|1|0|0|0|0|0|0|0|
|0|0|0|0|0|0|0|0|0|0|0|1|0|0|0|0|0|0|
|0|0|0|0|0|0|0|0|0|0|0|0|1|0|0|0|0|0|
|0|0|0|0|0|0|0|0|0|0|0|0|0|1|0|0|0|0|
|0|0|0|0|0|0|0|0|0|0|0|0|0|0|1|0|0|0|
|0|0|0|0|0|0|0|0|0|0|0|0|0|0|0|1|0|0|
|0|0|0|0|0|0|0|0|0|0|0|0|0|0|0|0|1|0|
|0|0|0|0|0|0|0|0|0|0|0|0|0|0|0|0|0|1.|

15. A decoder comprising:

a processor; and a non-transitory computer readable storage medium storing programming when executed by the processor, the programming including instructions to:

decode a code word using a low density parity check (LDPC) code in which each n adjacent rows in an extension part of a base parity check matrix (PCM), associated with the LDPC code, are orthogonal except for punctured information columns, n being an integer greater than one, wherein each two adjacent rows in a core matrix of the base PCM are orthogonal except for the punctured information columns and dual diagonal parity check columns, and wherein each m rows in the punctured information columns in the extension part of the base PCM have fewer than two conflicts, m being an integer greater than one.

16. The decoder of claim 15, wherein n=4.

17. The decoder of claim 15, wherein m=2.

18. An encoder comprising:

a processor; and a non-transitory computer readable storage medium storing programming when executed by the processor, the programming including instructions to:

encode information bits into a code word, wherein the information bits are encoded using a low density parity check (LDPC) code in which each n adjacent rows in an extension part of a base parity check matrix (PCM), associated with the LDPC code, are orthogonal except for punctured information columns, n being an integer greater than one, wherein each 2 adjacent rows in a core matrix of the base PCM are orthogonal except for the punctured information columns and dual diagonal parity check columns, wherein each m rows in the punctured information columns in the extension part of the base PCM have fewer than two conflicts, m being an integer greater than one.

19. The encoder of claim 18, wherein n=4.

20. The encoder of claim 18, wherein m=2.

* * * * *